US012628477B2

(12) United States Patent      (10) Patent No.:   US 12,628,477 B2

Wu et al.      (45) Date of Patent:     May 12, 2026

(54) DISPLAY PANEL AND METHOD OF FABRICATING THE SAME

(71) Applicant: AUO Corporation, Hsinchu (TW)

(72) Inventors: Yang-En Wu, Hsinchu (TW);
Shih-Hsiung Lin, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 405 days.

(21) Appl. No.: 18/527,396

(22) Filed: Dec. 4, 2023

(65) Prior Publication Data

US 2025/0081684 A1     Mar. 6, 2025

(30) Foreign Application Priority Data

Sep. 1, 2023    (TW)  ................................. 112133197

(51) Int. Cl.
| | |
|---|---|
| *H10H 20/851* | (2025.01) |
| *G09G 3/00* | (2006.01) |
| *H10H 20/01* | (2025.01) |
| *H10H 20/80* | (2025.01) |
| *H10H 20/831* | (2025.01) |
| *H10H 20/857* | (2025.01) |
| *H10H 29/14* | (2025.01) |
| *H10W 90/00* | (2026.01) |

(52) U.S. Cl.
CPC ......... *H10H 20/8514* (2025.01); *G09G 3/006* (2013.01); *H10H 20/831* (2025.01); *H10H 20/857* (2025.01); *H10H 29/142* (2025.01); *H10W 90/00* (2026.01); *G09G 2330/12* (2013.01); *H10H 20/032* (2025.01); *H10H 20/0361* (2025.01); *H10H 20/882* (2025.01)

(58) Field of Classification Search
None
See application file for complete search history.

(56) References Cited

U.S. PATENT DOCUMENTS

| | | | | |
|---|---|---|---|---|
| 9,379,237 | B1 * | 6/2016 | Chang | .................. H10D 30/603 |
| 9,660,020 | B2 * | 5/2017 | Lu | ......................... H10D 62/109 |

(Continued)

FOREIGN PATENT DOCUMENTS

| | | | | |
|---|---|---|---|---|
| CN | 101404250 | A * | 4/2009 | ....... H01L 21/02576 |
| CN | 105023522 | | 11/2015 | |

(Continued)

*Primary Examiner* — Michael Lebentritt
(74) *Attorney, Agent, or Firm* — JCIPRNET

(57)           ABSTRACT

A display panel including a circuit substrate, first display sub-pixels and a repaired display sub-pixel is provided. The first display sub-pixel includes a light-emitting device and a first color conversion pattern. The light-emitting device is disposed on the circuit substrate, and is suitable for emitting first light with a first light-emitting color. The first color conversion pattern is arranged on the light-emitting device, and overlaps the light-emitting device. The first color conversion pattern is suitable for converting the first light-emitting color of the first light into a first color. The first color is different from the first light-emitting color. The repaired display sub-pixel includes a repair light-emitting device arranged on the circuit substrate, and having a second light-emitting color. The second light-emitting color is the same as the first color. A method of fabricating the display panel is also provided.

25 Claims, 26 Drawing Sheets

10

(56) References Cited

U.S. PATENT DOCUMENTS

| | | | | |
|---|---|---|---|---|
| 2008/0251863 A1 * | 10/2008 | Huang | ............ | H10D 30/603 |
| | | | | 257/E27.06 |
| 2012/0286359 A1 * | 11/2012 | Lin | ............ | H10D 30/65 |
| | | | | 257/E29.256 |
| 2013/0234246 A1 * | 9/2013 | Yang | ............ | H10W 10/014 |
| | | | | 257/E29.256 |
| 2014/0027849 A1 * | 1/2014 | Yang | ............ | H10D 30/60 |
| | | | | 257/E21.409 |
| 2014/0167173 A1 * | 6/2014 | Ito | ............ | H10D 30/0221 |
| | | | | 438/294 |
| 2015/0076610 A1 * | 3/2015 | Ito | ............ | H10D 30/603 |
| | | | | 257/365 |
| 2016/0181358 A1 * | 6/2016 | Zhang | ............ | H10D 62/109 |
| | | | | 438/283 |
| 2016/0351092 A1 | 12/2016 | Chen et al. | | |
| 2021/0233999 A1 * | 7/2021 | Malinowski | ......... | H10D 62/151 |
| 2021/0249516 A1 * | 8/2021 | Li | ............ | H10D 64/231 |
| 2023/0136827 A1 * | 5/2023 | Xue | ............ | H10D 62/83 |
| | | | | 257/339 |
| 2023/0253413 A1 | 8/2023 | Basrur et al. | | |
| 2023/0290674 A1 * | 9/2023 | Ho | ............ | H10W 20/081 |
| 2024/0243124 A1 * | 7/2024 | Yang | ............ | H10D 84/0128 |

FOREIGN PATENT DOCUMENTS

| | | | | |
|---|---|---|---|---|
| CN | 114023780 | 2/2022 | | |
| CN | 111279488 B | * 2/2025 | ....... | H01L 21/26513 |
| DE | 10036891 A1 | * 3/2001 | ............ | H10D 8/051 |
| EP | 0936676 A2 | * 8/1999 | ....... | H01L 21/76224 |
| GB | 2561388 A | * 10/2018 | ............ | H10P 30/21 |
| KR | 20180131722 A | * 12/2018 | ........... | H01L 21/761 |

* cited by examiner

DISPLAY PANEL AND METHOD OF FABRICATING THE SAME

CROSS-REFERENCE TO RELATED APPLICATION

This application claims the priority benefit of Taiwan application serial no. 112133197, filed on Sep. 1, 2023. The entirety of the above-mentioned patent application is hereby incorporated by reference herein and made a part of this specification.

BACKGROUND

Technical Field

The invention relates to a display technology and a fabricating method, and particularly relates to display panel and a method of fabricating the same.

Description of Related Art

In addition to advantages of low energy consumption and long material life, micro-LED displays also have excellent optical performance, such as high color saturation, fast response and high contrast. In order to achieve lower production costs and larger product design margins, a manufacturing technology of the micro-LED displays may adopt mass transfer or wafer to wafer bonding to transfer micro-LED chips pre-made by a chip manufacturer to driving circuit boards of different products.

In order to meet the demand for color display, a display using monochromatic micro-LEDs in collaboration with a color conversion technology is proposed. After completing transfer of the monochromatic chips, this type of display may further form a color conversion layer above the chips to convert a color of light emitted by the chips into a required display color. However, if dead pixels are found during the subsequent manufacturing process or after a durability test, the arrangement of the color conversion layer may greatly increase repair difficulty of such type of display, making it impossible to repair and resulting in a low yield rate.

SUMMARY

The invention is directed to a display panel with a color conversion pattern, which has high repairability after a durability test.

The invention is directed to a method for fabricating a display panel, which significantly reduces generation of scrap products and improve a production yield.

The invention provides a display panel including a circuit substrate, a plurality of first display sub-pixels and a repaired display sub-pixel. The first display sub-pixel includes a light-emitting device and a first color conversion pattern. The light-emitting device is disposed on the circuit substrate, and is suitable for emitting first light with a first light-emitting color. The first color conversion pattern is arranged on the light-emitting device, and is overlapped with the light-emitting device. The first color conversion pattern is suitable for converting the first light-emitting color of the first light into a first color. The first color is different from the first light-emitting color. The repaired display sub-pixel includes a repair light-emitting device arranged on the circuit substrate, and has a second light-emitting color. The second light-emitting color is the same as the first color.

The invention provides a method of fabricating a display panel including following steps. A plurality of light-emitting devices are electrically bonded to a circuit substrate, a plurality of color conversion patterns are formed, an inspection step is performed to confirm a damaged one of the plurality of light-emitting devices, and a repair light-emitting device is electrically bonded to the circuit substrate to replace the damaged one of the light-emitting devices. Each of the light-emitting devices is adapted to emit first light with a first light-emitting color. The plurality of color conversion patterns are respectively overlapped with the plurality of light-emitting devices. Each of the color conversion patterns is adapted to convert the first light-emitting color of the first light into a first color. The first color is different from the first light-emitting color. The repair light-emitting device has a second light-emitting color, and the second light-emitting color is the same as the first color.

Based on the above descriptions, in the display panel and the method of fabricating the same according to an embodiment of the invention, the plurality of display sub-pixels used to display the first color are each provided with a light-emitting device and a color conversion pattern overlapped with each other, where the color conversion pattern is suitable for converting the light-emitting color of the light-emitting device into the first color. If the light-emitting device of one of the display sub-pixels is detected to be abnormal or damaged, the abnormal or damaged light-emitting device may be replaced by the repair light-emitting device having the first color. In this way, the repairability of the display panel after product test in the back-end process may be greatly improved, which helps to reduce generation of scrap products and improve the production yield.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
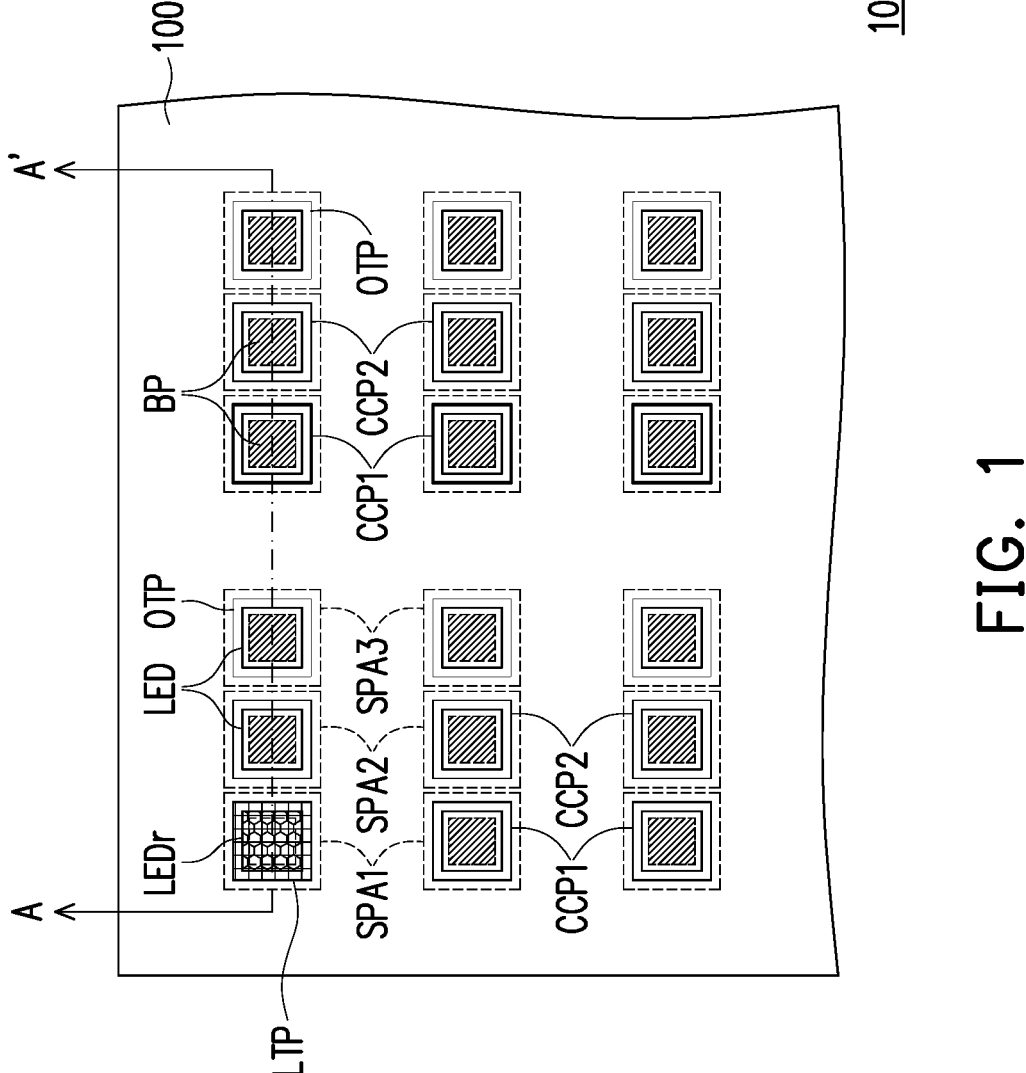
FIG. 1 is a schematic front view of a display panel according to a first embodiment of the invention.
Figure 1:
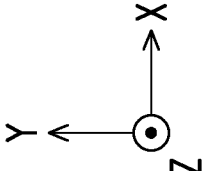

The terms "about", "substantial" or "approximate" used herein include the related value and an average within an acceptable deviation range for a specific value determined by those skilled in the art, considering a discussed measurement and a specific number of errors related to the measurement (i.e., a limitation of a measuring system). For example, "about" may represent a range within one or a plurality of standard deviations of the related value, or within ±30%, 20%, ±15%, 10%, ±5%. In addition, an acceptable deviation range or standard deviation may be selected for the terms "about", "approximate", "essential", or "substantial" used in the specification based on measurement properties, cutting properties, or other properties without using one standard deviation for all properties.

In the drawings, the thickness of layers, films, panels, regions, etc., are exaggerated for clarity's sake. It will be understood that when a component such as a layer, a film, a region, or a substrate is referred to be "on" or "connected to" another component, it may be directly on or connected to the other another component, or intermediate components may also exist there between. Comparatively, when a component is referred to be "directly on" or "directly connected" to another, none other intermediate component exits there between. As used herein, the "connection" may refer to physical and/or electrical connection. Furthermore, "electrical connection" of two components may refer to that other components may exist between the two components.

Reference will now be made in detail to the present preferred embodiments of the invention, examples of which are illustrated in the accompanying drawings. Wherever possible, the same reference numbers are used in the drawings and the description to refer to the same or like parts.

Figure 2:
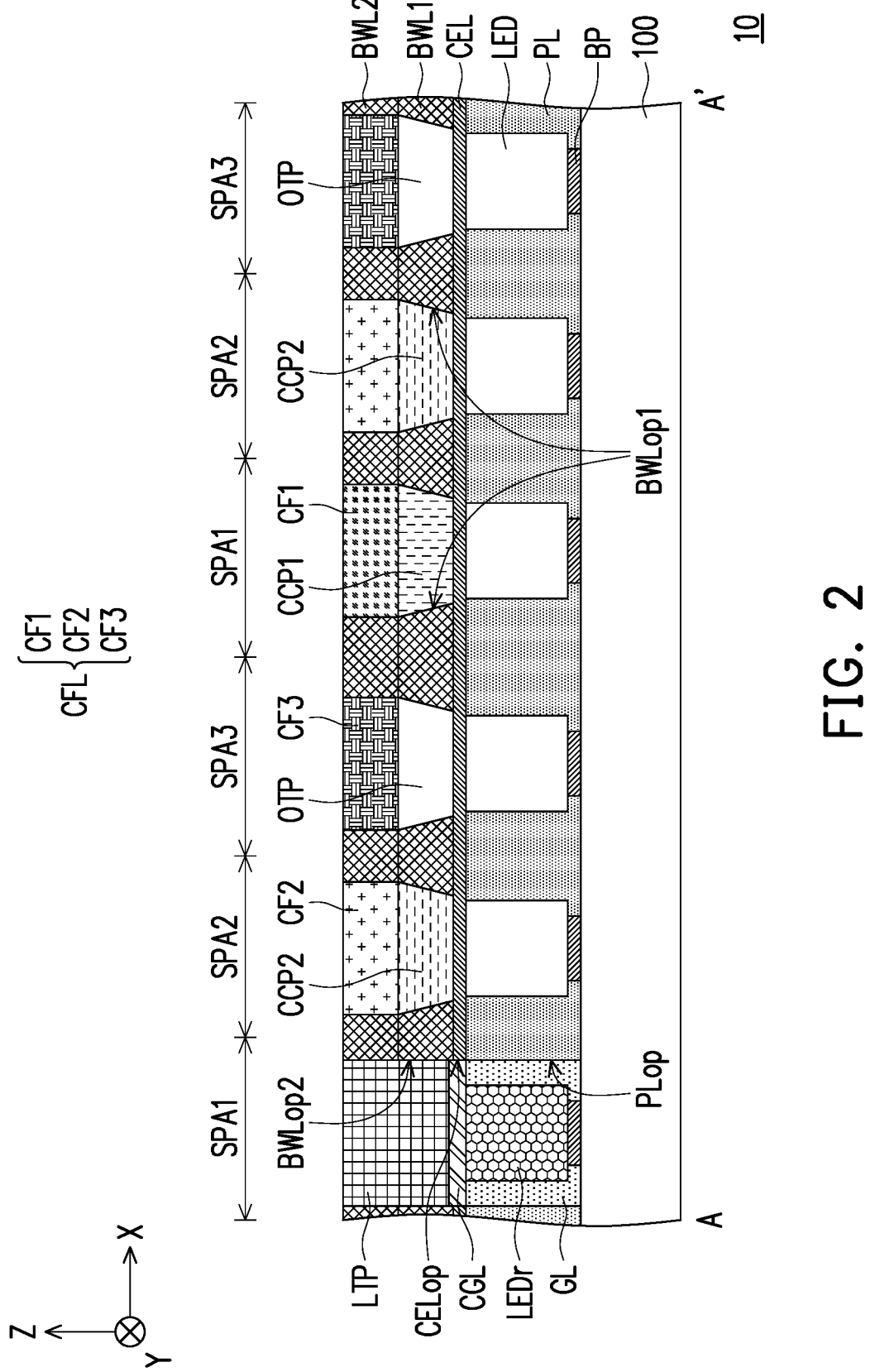
FIG. 2 is a schematic cross-sectional view of the display panel of FIG. 1.

FIG. 1 is a schematic front view of a display panel according to a first embodiment of the invention. FIG. 2 is a schematic cross-sectional view of the display panel of FIG. 1. FIG. 3A to FIG. 3G are schematic cross-sectional views of a fabrication process of the display panel of FIG. 2. FIG. 2 corresponds to a section line A-A' of FIG. 1. For the sake of clarity, FIG. 1 only illustrates a circuit substrate 100, light-emitting devices LED, a repair light-emitting device LEDr, bonding pads BP, first color conversion patterns CCP1, second color conversion patterns CCP2, optical patterns OTP and light-transmitting patterns LTP.

Referring to FIG. 1 and FIG. 2, a display panel 10 includes the circuit substrate 100, a plurality of first display sub-pixels, a plurality of second display sub-pixels and a plurality of third display sub-pixels. The circuit substrate 100 includes, for example, a plurality of bonding pads BP, a plurality of data lines (not shown), a plurality of scan lines, a plurality of power lines and a plurality of active devices, but the invention is not limited thereto. The first display sub-pixels, the second display sub-pixels and the third display sub-pixels are respectively used to display a first color, a second color and a third color, where the first color, the second color and the third color are, for example, red, green and blue, but the invention is not limited thereto.

In the embodiment, the circuit substrate 100 may be provided with a plurality of first display sub-pixel areas SPA1, a plurality of second display sub-pixel areas SPA2 and a plurality of third display sub-pixel areas SPA3. The first display sub-pixel areas SPA1 are configured with the plurality of first display sub-pixels. The second display sub-pixel areas SPA2 are configured with the plurality of second display sub-pixels. The third display sub-pixel areas SPA3 are configured with the plurality of third display sub-pixels.

In the embodiment, the plurality of first display sub-pixel areas SPA1 (or the plurality of first display sub-pixels) may be arranged into a plurality of first display sub-pixel columns along a direction Y, the plurality of second display sub-pixel areas SPA2 (or the plurality of second display sub-pixels) may be arranged in a plurality of second display sub-pixel columns along the direction Y, and the plurality of third display sub-pixel areas SPA3 (or the plurality of third display sub-pixels) may be arranged in a plurality of third display sub-pixel columns along the direction Y. The first display sub-pixel columns, the second display sub-pixel columns and the third display sub-pixel columns may be alternately arranged along a direction X. However, the invention is not limited thereto. In other embodiments, the type and arrangement of the display sub-pixels may be adjusted according to different application requirements.

In the embodiment, the display panel 10 further includes at least one repair light-emitting device LEDr, at least one light-transmitting pattern LTP, a plurality of light-emitting devices LED, a plurality of first color conversion patterns CCP1, a plurality of second color conversion patterns CCP2 and a plurality of optical patterns OTP. The plurality of light-emitting devices LED and the at least one repair light-emitting device LEDr are disposed on the circuit substrate 100. The light-transmitting patterns LTP, the optical patterns OTP and the color conversion patterns are arranged on the light-emitting devices LEDs and the repair light-emitting device LEDr. Each display sub-pixel area may be provided with one light-emitting device LED or one repair light-emitting device LEDr. Each display sub-pixel area may also be provided with one color conversion pattern, one optical pattern OTP or one light-transmitting pattern LTP. A material of the light-transmitting pattern LTP may be an organic material, such as epoxy resin, silicone glue, acrylic glue, polycarbonate, or a mixture of epoxy resin and acrylic glue, but the invention is not limited thereto.

A material of the optical pattern OTP may be a high-penetration polymer material, such as epoxy resin, silicone, acrylic glue, polycarbonate, or a mixture of epoxy resin and acrylic glue, etc., but the invention is not limited thereto.

For example, one light-emitting device LED and one first color conversion pattern CCP1 that constitute the first display sub-pixel and overlap with each other may be disposed in the first display sub-pixel area SPA1. One light-emitting device LED and one second color conversion pattern CCP2 that constitute the second display sub-pixel and overlap with each other may be disposed in the second display sub-pixel area SPA2. One light-emitting device LED and one optical pattern OTP that constitute the third display sub-pixel and overlap with each other may be disposed in the third display sub-pixel area SPA3. The overlapping relationship mentioned here means that, for example, the light-emitting device LED and the color conversion pattern or the optical pattern OTP overlap with each other along a direction Z. Unless otherwise mentioned below, the overlapping relationship between two components is defined in the same way, and the overlapping direction of the two components will not be described again.

In the first display sub-pixel area SPA1, the light-emitting device LED is adapted to emit first light (not shown) with a first light-emitting color. The first color conversion pattern CCP1 is adapted to convert the first light-emitting color of the first light into a first color, and the first color is different from the first light-emitting color. In the second display sub-pixel area SPA2, the light-emitting device LED is adapted to emit second light (not shown) with the first light-emitting color. The second color conversion pattern CCP2 is suitable for converting the first light-emitting color of the second light into a second color, and the second color is different from the first color and the first light-emitting color. In the third display sub-pixel area SPA3, the light-emitting device LED is adapted to emit third light (not shown) with the first light-emitting color. The optical pattern OTP is adapted to allow the third light to pass through and use the first light-emitting color as a third color for display.

For example, in the embodiment, the first display sub-pixel in one of the plurality of first display sub-pixel areas SPA1 is actually a repaired display sub-pixel that has been repaired. In the repaired first display sub-pixel area SPA1, the abnormal or damaged light-emitting device LED is replaced by the repair light-emitting device LEDr. It is particularly important to note that the repair light-emitting device LEDr has the second light-emitting color. The second light-emitting color is different from the first light-emitting color of the light-emitting device LED, but is the same as a display color of the first display sub-pixel area SPA1 (i.e., the first color).

Namely, the display color of the repaired first display sub-pixel area SPA1 is not obtained by converting the first light-emitting color of the light-emitting device LED into the first color through the first color conversion pattern CCP1, but directly adopt the second light-emitting color of the repair light-emitting device LEDr as the display color. Therefore, in the embodiment, the second light-emitting color of the repair light-emitting device LEDr is, for example, red. On the other hand, in order to improve the durability of the repair light-emitting device LEDr, the repair light-emitting device LEDr may be a quaternary light-emitting diode or a ternary light-emitting diode, and a manufacturing material thereof includes, for example, AlGaInP, InGaN, GaAlAs or GaAsP.

Furthermore, the display panel 10 further includes a planarization layer PL, which is disposed on the circuit substrate 100 and covers the plurality of light-emitting devices LED. The planarization layer PL has an opening PLop overlapped with the repair light-emitting device LEDr, and the repair light-emitting device LEDr is disposed in the opening PLop.

In the embodiment, the light-emitting device LED and the repair light-emitting device LEDr may be vertical type light-emitting devices, and a bonding pad BP may be provided in each display sub-pixel area to electrically connect one end of the light-emitting device or the repair light-emitting device LEDr. The display panel 10 may further optionally include a common electrode layer CEL, which is disposed on the plurality of light-emitting devices LED and the repair light-emitting device LEDr, and electrically connects the light-emitting devices LED and the repair light-emitting device LEDr.

Particularly, the common electrode layer CEL covers the planarization layer PL and the plurality of light-emitting devices LED, and has an opening CELop overlapped with the repair light-emitting device LEDr. In other words, the common electrode layer CEL does not directly contact the repair light-emitting device LEDr. Instead, the opening PLop of the planarization layer PL is filled with a glue layer GL, and the opening CELop of the common electrode layer CEL is filled with a transparent conductive glue layer CGL. To be more specific, the repair light-emitting device LEDr is electrically connected to the common electrode layer CEL via the transparent conductive glue layer CGL.

In the embodiment, the display panel 10 may further include a barrier wall structure layer BWL1 disposed on the common electrode layer CEL. The barrier wall structure layer BWL1 has a plurality of first openings BWLop1 and a second opening BWLop2. The plurality of first openings BWLop1 are respectively overlapped with the plurality of light-emitting devices LED, and the second opening BWLop2 is overlapped with the repair light-emitting device LEDr.

For example, the barrier wall structure layer BWL1 is provided with the first color conversion pattern CCP1 of the first display sub-pixel in the first opening BWLop1 that is overlapped with the first display sub-pixel area SPA1. The barrier wall structure layer BWL1 is provided with the second color conversion pattern CCP2 of the second display sub-pixel in the first opening BWLop1 that is overlapped with the second display sub-pixel area SPA2. The barrier wall structure layer BWL1 is provided with the optical pattern OTP of the third display sub-pixel in the first opening BWLop1 that is overlapped with the third display sub-pixel area SPA3.

It should be noted that the barrier wall structure layer BWL1 is not provided with the first color conversion pattern CCP1 in the second opening BWLop2 that is overlapped with the repaired first display sub-pixel area SPA1, but is filled with the light-transmitting pattern LTP.

In order to prevent a part of the light emitted by the light-emitting devices LED from being emitted as the light-emitting color is not converted by the color conversion pattern to cause a decrease in color purity of the display color, the display panel 10 may further include a color filter layer CFL. The color filter layer CFL may have a plurality of filter patterns CF1, a plurality of filter patterns CF2, and a plurality of filter patterns CF3. The plurality of filter patterns CF1 are respectively overlapped with the plurality of first color conversion patterns CCP1 in the plurality of first display sub-pixel areas SPA1. The plurality of filter patterns CF2 are respectively overlapped with the plurality of second color conversion patterns CCP2 in the plurality of second display sub-pixel areas SPA2. The plurality of filter patterns CF3 are respectively overlapped with the plurality of optical patterns OTP in the plurality of third display sub-pixel areas SPA3. In the embodiment, a barrier wall structure layer BWL2 may be disposed between the plurality of filter patterns CF1, the plurality of filter patterns CF2, and the plurality of filter patterns CF3.

It should be noted that the barrier wall structure layer BWL2 is not provided with the filter pattern CF1 in the opening that is overlapped with the repaired first display sub-pixel area SPA1, but is filled with the light-transmitting pattern LTP. Namely, the aforementioned light-transmitting pattern LTP filled in the second opening BWLop2 of the barrier wall structure layer BWL1 further penetrates the color filter layer CFL.

A method of fabricating the display panel 10 will be exemplarily described below.

Figures 3A, 3B:
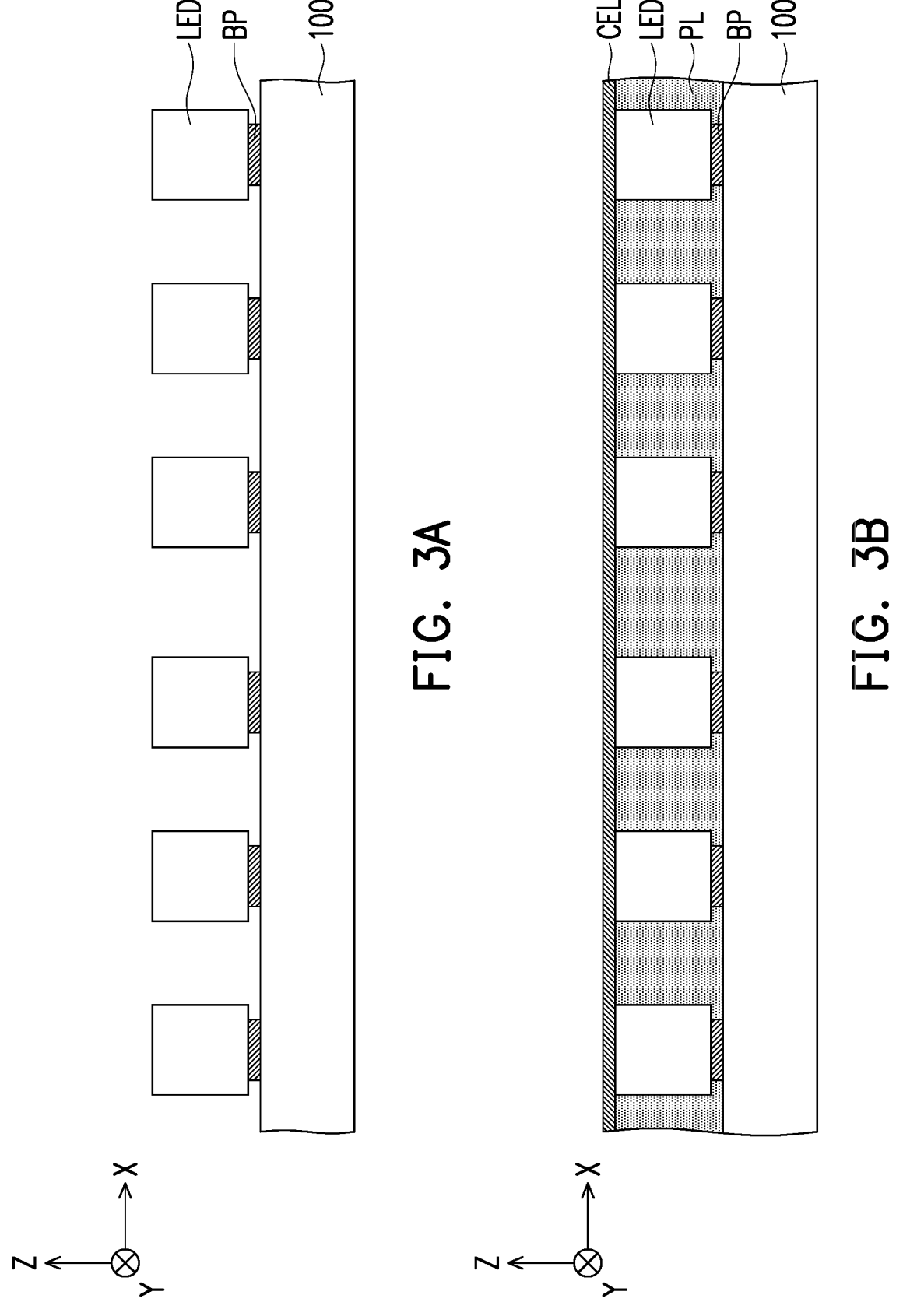
FIG. 3A to FIG. 3G are schematic cross-sectional views of a fabrication process of the display panel of FIG. 2.

Referring to FIG. 3A, first, the plurality of light-emitting devices LED are electrically bonded to the circuit substrate 100. For example, in the embodiment, these light-emitting devices LED may be pre-fabricated on a growth substrate (such as a wafer), and wafer to wafer bonding is adopted to transfer these light-emitting devices LED to the circuit substrate 100 in batches. After bonding between the light-emitting devices LED and the plurality of bonding pads BP on the circuit substrate 100 is completed, the growth substrate is removed from the above of the light-emitting devices LED. However, the invention is not limited thereto. In other embodiments, these light-emitting devices LED may also be placed on the circuit substrate 100 from a temporary substrate in a manner of mass transfer.

After completing the bonding step of the plurality of light-emitting devices LED and the circuit substrate 100, the planarization layer PL is formed to cover the light-emitting devices LED, as shown in FIG. 3B. Then, the common electrode layer CEL is formed on the planarization layer PL and the plurality of light-emitting devices LED. The common electrode layer CEL directly covers these light-emitting devices LED to form an electrical connection relationship.

Figure 3C:
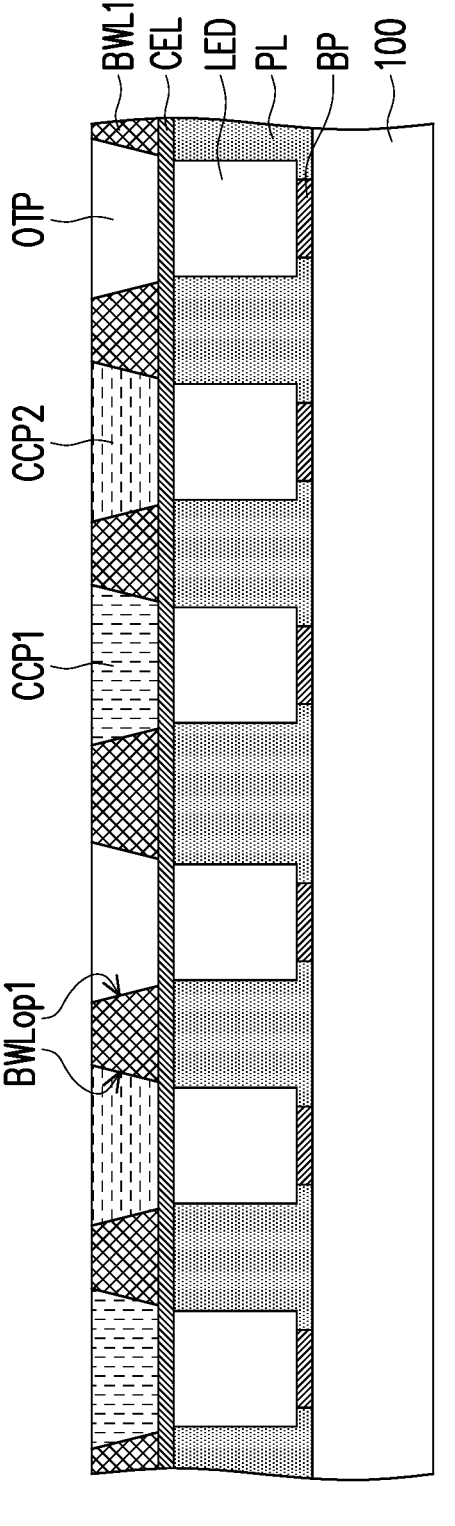

Referring to FIG. 3C, the plurality of first color conversion patterns CCP1, the plurality of second color conversion patterns CCP2 and the plurality of optical patterns OTP are formed on the common electrode layer CEL. In the embodiment, before the step of forming the color conversion patterns and the optical pattern OTP, the barrier wall structure layer BWL1 having the plurality of first openings BWLop1 may be formed first, and each first opening BWLop1 is filled with the first color conversion pattern CCP1, the second color conversion pattern CCP2 or the optical pattern OTP. In the embodiment, a material of the barrier wall structure layer BWL1 may include a black resin material or an organic material doped with carbon black, but the invention is not limited thereto. In other embodiments, the material of the barrier wall structure layer BWL1 may also include white resin, Bragg reflector or other materials with high reflectivity.

Figure 3D:
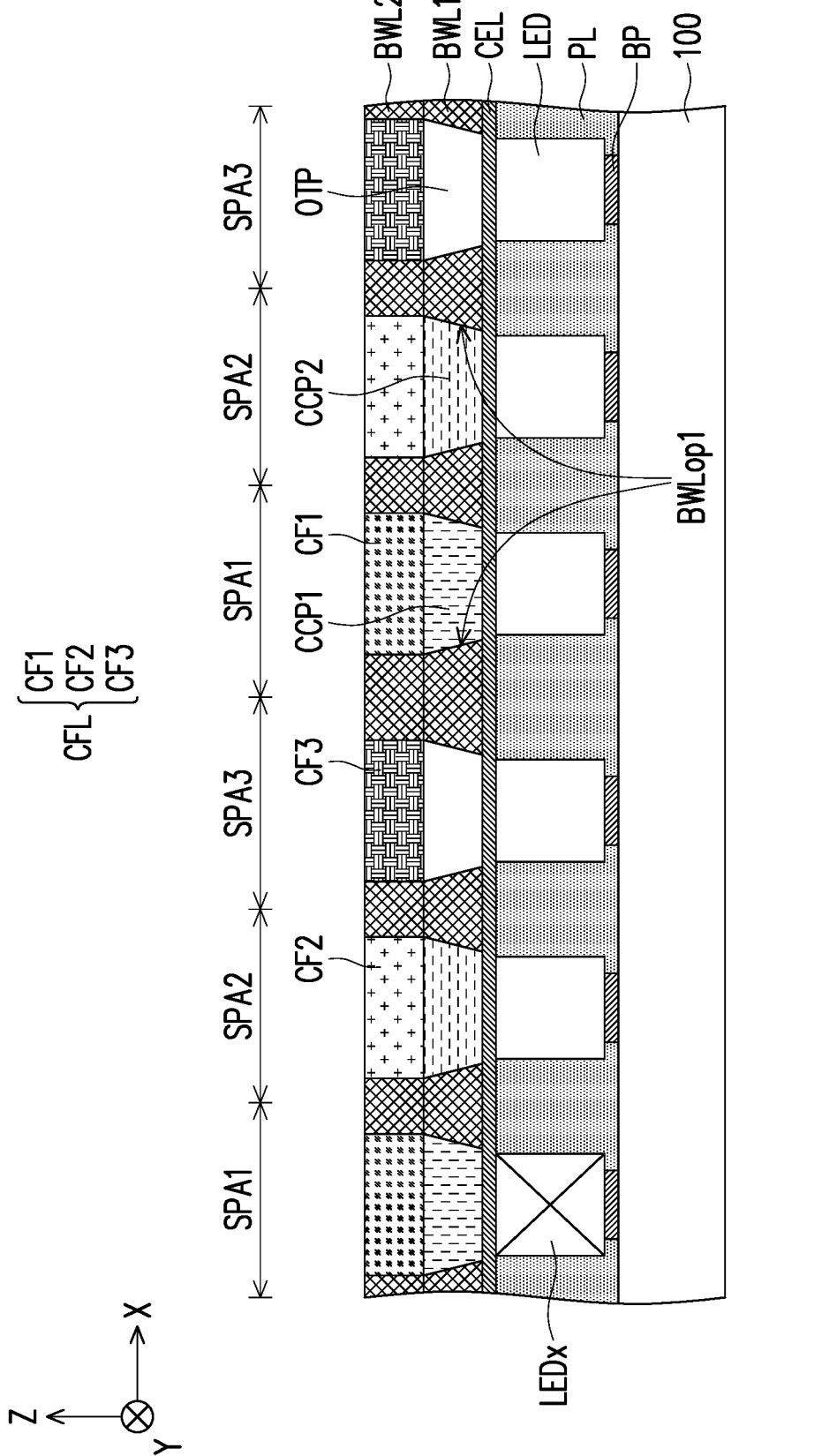

Referring to FIG. 3D, the color filter layer CFL having the plurality of filter patterns CF1 to CF3 is formed on the plurality of first color conversion patterns CCP1, the plurality of second color conversion patterns CCP2 and the plurality of optical patterns OTP. Before the step of forming the color filter layer CFL, the barrier wall structure layer BWL2 having a plurality of openings may be formed first, and the plurality of filter patterns CF1 to CF3 are respectively provided in these openings.

By now, the fabrication of the display panel is roughly completed. Then, an aging durability test of the display panel is performed. After the test is completed, an inspection step is performed to confirm whether all light-emitting devices LED are normal. For example, if it is detected that the light-emitting device LED in one of the first display sub-pixel areas SPA1 is a damaged (or abnormal) light-emitting device LEDx, a repair process of the display panel is performed.

Figure 3E:
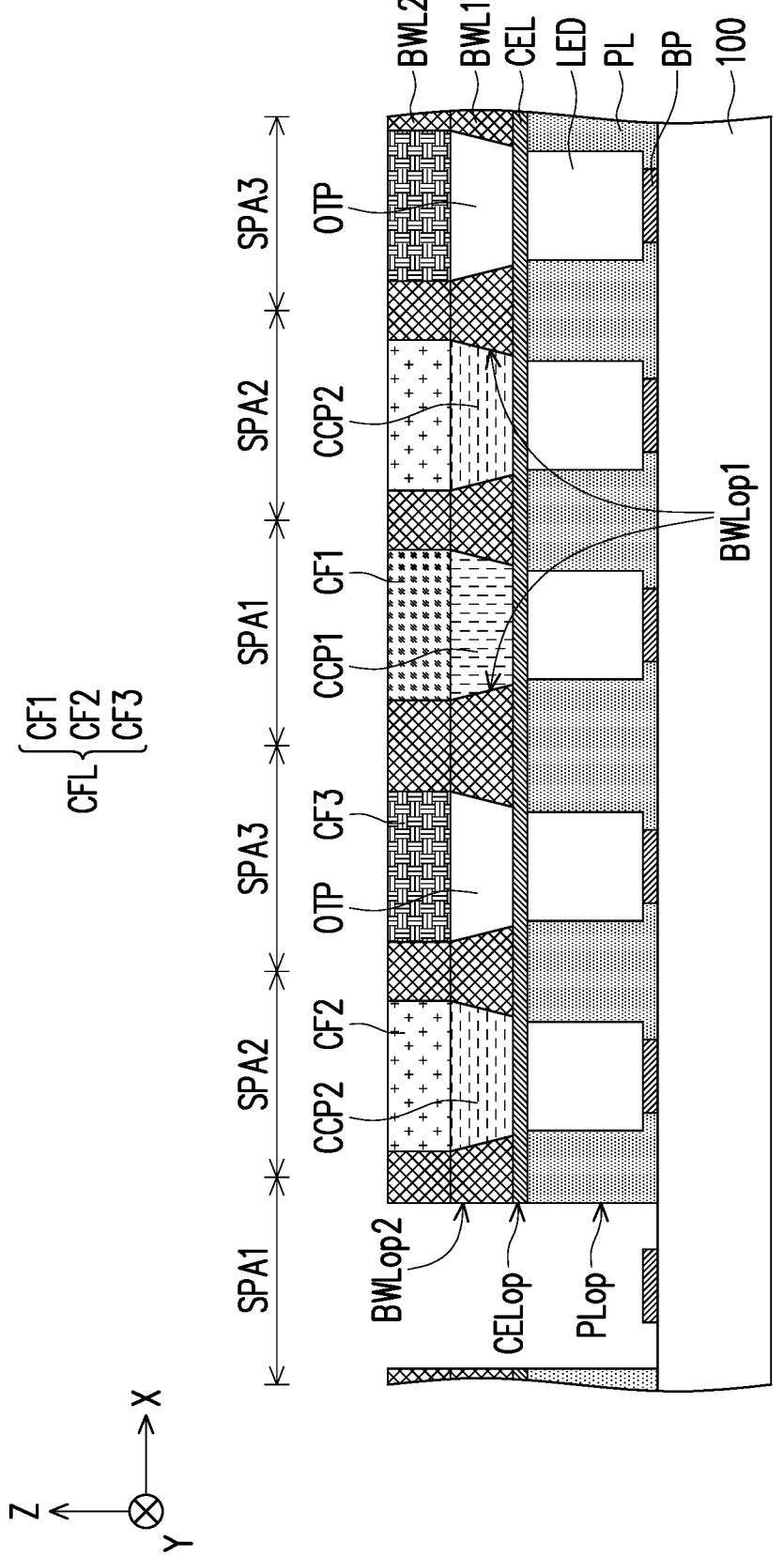

Referring to FIG. 3D and FIG. 3E, after detecting the damaged light-emitting device LEDx, the filter pattern CF1 overlapped with the damaged light-emitting device LEDx in the color filter layer CFL, the first color conversion pattern CCP1 overlapped with the damaged light-emitting device LEDx, and the portion of the common electrode layer CEL overlapped with the damaged light-emitting device LEDx, the portion of the planarization layer PL that covers the damaged light-emitting device LEDx and the damaged light-emitting device LEDx are removed to form a groove to expose the bonding pad BP that is originally bonded to the damaged light-emitting device LEDx. The above-mentioned groove is, for example, composed of the opening PLop of the planarization layer PL, the opening CELop of the common electrode layer CEL, and the second opening BWLop2 of the barrier wall structure layer BWL1.

Figure 3F:
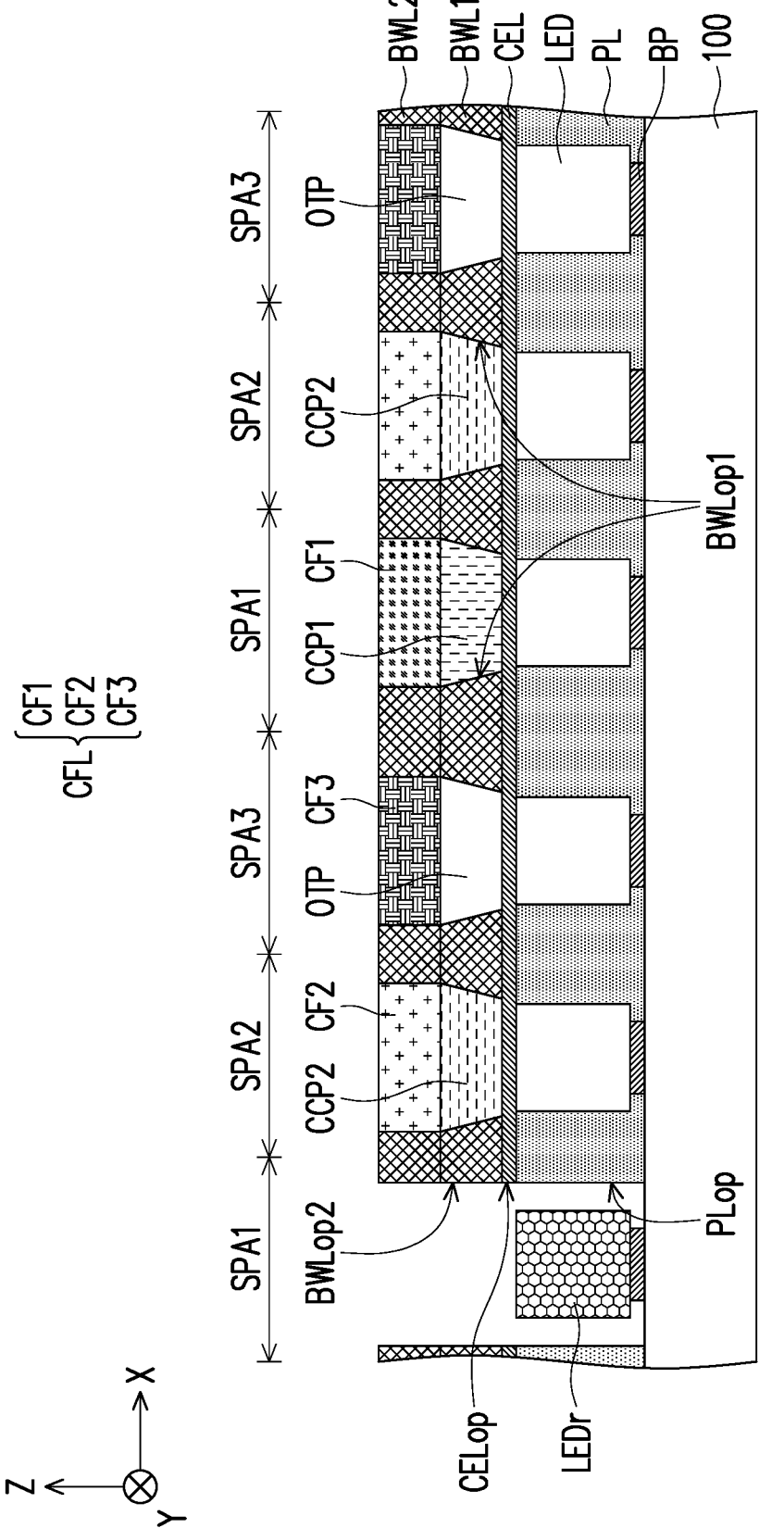
Figure 3G:
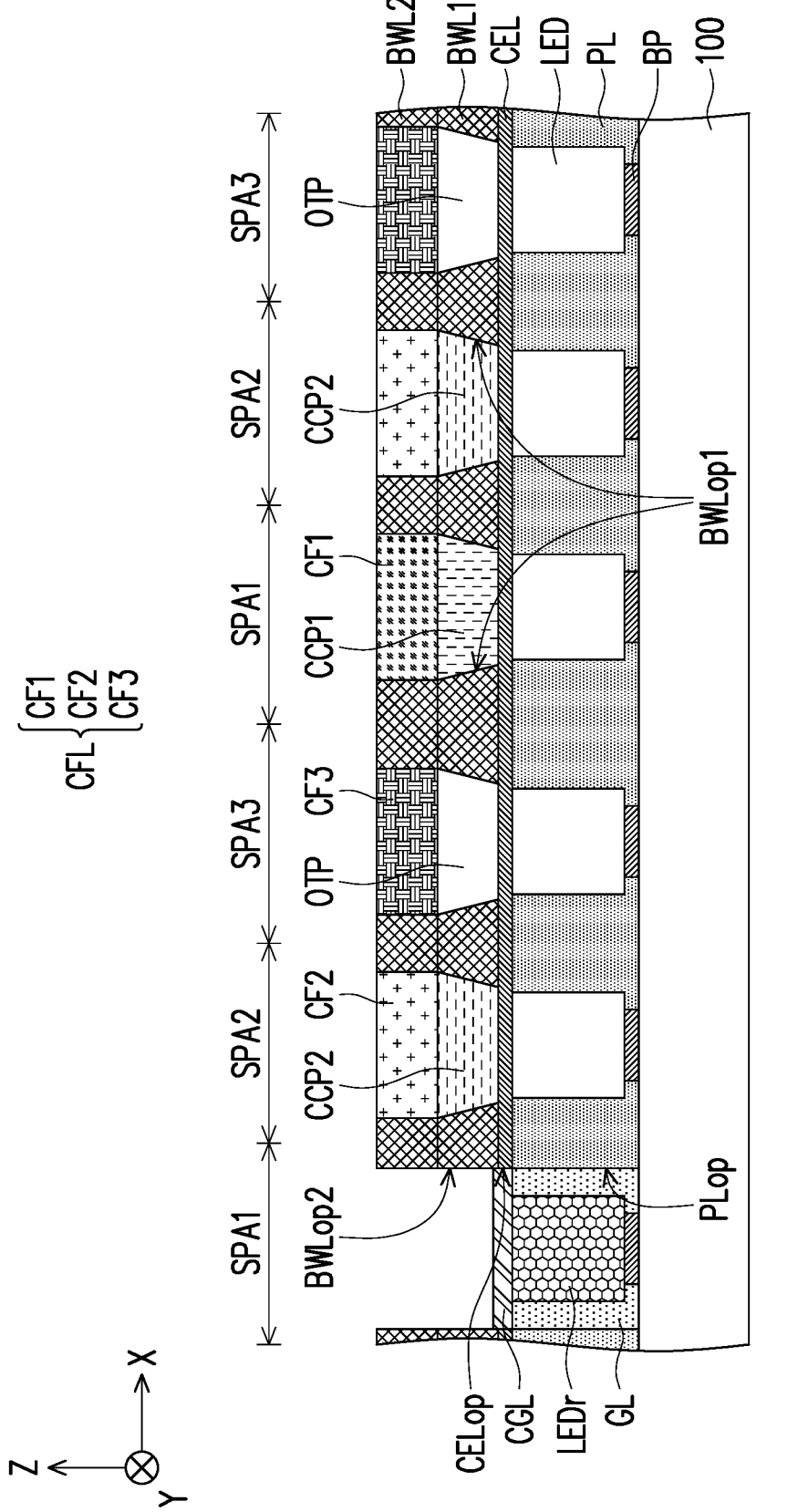

Then, the repair light-emitting device LEDr is electrically bonded to the circuit substrate 100 through the aforementioned groove (as shown in FIG. 3F) to replace the damaged and removed light-emitting device LEDx. Referring to FIG. 3G, after completing the bonding step of the repair light-emitting device LEDr, a glue layer GL is formed in the opening PLop of the planarization layer PL to cover the repair light-emitting device LEDr, and the transparent conductive glue layer CGL is formed in the opening CELop of the common electrode layer CEL to realize the electrical connection between the repair light-emitting device LEDr and the common electrode layer CEL.

Since the second light-emitting color of the repair light-emitting device LEDr is different from the first light-emitting color of the light-emitting device LED, but is the same as the display color of the first display sub-pixel (i.e., the first color), after completing the electrical connection of the repair light-emitting device LEDr and the common electrode layer CEL, the light-transmitting pattern LTP covering the transparent conductive glue layer CGL may be directly formed in the second opening BWLop2 of the barrier wall structure layer BWL1, and the light-transmitting pattern LTP further extends through the color filter layer CFL, as shown in FIG. 2 and FIG. 3G.

More clearly, there is no need to set the first color conversion pattern CCP1 in the repaired first display sub-pixel area SPA1, but the repair light-emitting device LEDr directly emits light with the display color. In this way, the repair process may be greatly simplified, which helps to improve a repair yield of the display panel 10.

By now, the fabrication of the display panel 10 of the embodiment is completed.

In the embodiment, the display panel 10 includes the circuit substrate 100, a plurality of first display sub-pixels and a repaired display sub-pixel. The first display sub-pixel includes the light-emitting device LED and the first color conversion pattern CCP1. The light-emitting device LED is disposed on the circuit substrate 100 and is adapted to emit the first light with the first light-emitting color. The first color conversion pattern CCP1 is disposed on the light-emitting device LED and is overlapped with the light-emitting device LED. The first color conversion pattern CCP1 is adapted to convert the first light-emitting color of the first light into the first color. The first color is different from the first light-emitting color. The repaired display sub-pixel includes the repair light-emitting device LEDr, which is disposed on the circuit substrate 100 and has the second light-emitting color. The second light-emitting color is the same as the first color.

Other embodiments are provided below to describe the disclosure in detail, in which the same components will be marked with the same symbols, and the description of the same technical content will be omitted. For the omitted parts, reference may be made to related descriptions of previous embodiments, and details thereof are not repeated.

Figure 4:
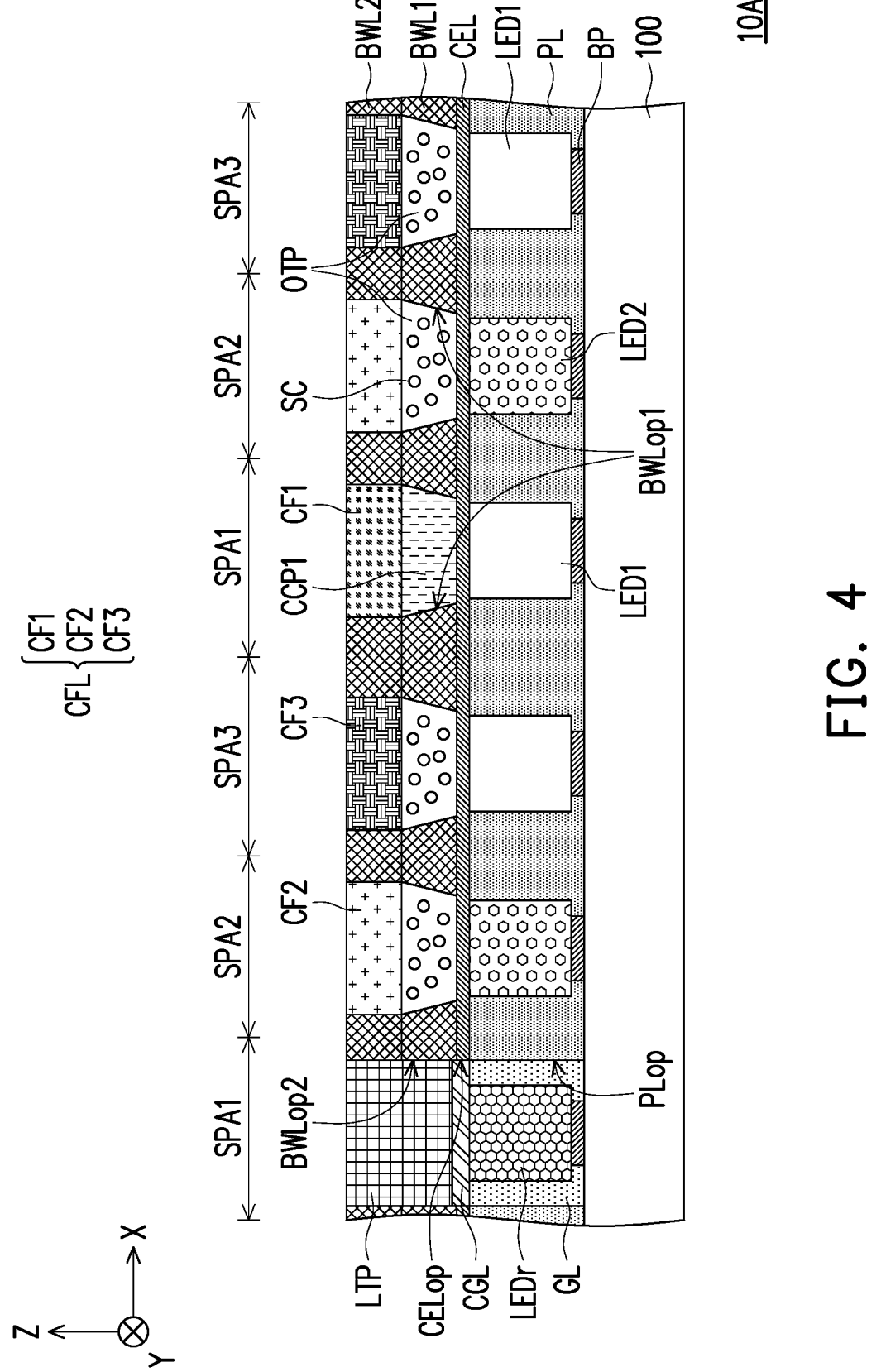
FIG. 4 is a schematic cross-sectional view of a display panel according to a second embodiment of the invention.

FIG. 4 is a schematic cross-sectional view of a display panel according to a second embodiment of the invention. Referring to FIG. 4, in the embodiment, a plurality of light-emitting devices LED1 are provided in a plurality of first display sub-pixel areas SPA1 and a plurality of third display sub-pixel areas SPA3 of a display panel 10A, and a plurality of light-emitting devices LED2 are provided in a plurality of second display sub-pixel areas SPA2. The light-emitting color of the light-emitting device LED2 is different from the light-emitting color of the light-emitting device LED1, but is the same as the display color of the second display sub-pixel. Therefore, the display panel 10A of the embodiment is provided with optical patterns OTP in the second display sub-pixel areas SPA2 to replace the second color conversion patterns CCP2 of the display panel 10 in FIG. 2.

In the embodiment, the optical patterns OTP may be doped with a plurality of scattering particles SC to improve a light emission angle range and light emission uniformity of the light emitted by the light-emitting devices LED1 or LED2 after passing through the optical patterns OTP.

Since the remaining components and configuration relationships of the embodiment are similar to that of the display panel 10 of FIG. 2, reference may be made to the relevant paragraphs of the aforementioned embodiment for detailed description, and details thereof are not repeated.

Figure 5:
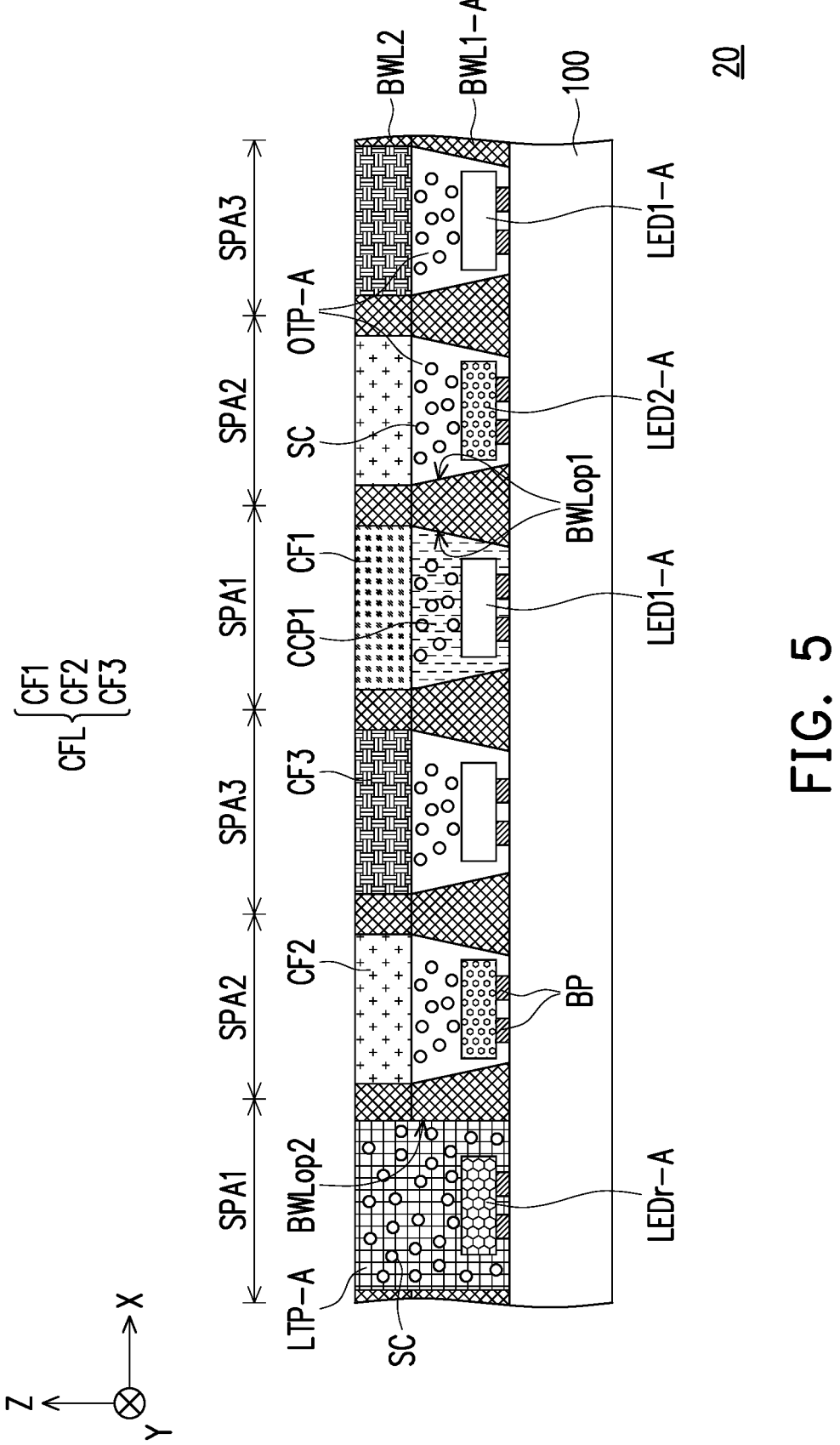
FIG. 5 is a schematic cross-sectional view of a display panel according to a third embodiment of the invention.

FIG. 5 is a schematic cross-sectional view of a display panel according to a third embodiment of the invention. FIG. 6A to FIG. 6E are schematic cross-sectional views of a fabrication process of the display panel of FIG. 5. Referring to FIG. 5, main differences between a display panel 20 of the embodiment and the display panel 10A of FIG. 4 lie in different types of the light-emitting devices and different configurations of the color conversion patterns and the optical patterns.

Specifically, in the display panel 20 of the embodiment, a barrier wall structure layer BWL1-A is directly provided on the circuit substrate 100. A plurality of light-emitting devices LED1-A and a plurality of light-emitting devices LED2-A are arranged in a plurality of first openings BWLop1 of the barrier wall structure layer BWL1-A, and a repair light-emitting device LEDr-A is arranged in a second opening BWLop2 of the barrier wall structure layer BWL1-A. Different from the light-emitting device LED1, the light-emitting device LED2 and the repair light-emitting device LEDr of FIG. 4, which are all vertical type light-emitting devices, the light-emitting devices LED1-A, the light-emitting devices LED2-A and the repair light-emitting device LEDr of the embodiment are all flip-chip type light-emitting devices. Therefore, a number of the bonding pads BP provided in each opening of the barrier wall structure layer BWL1-A is two, so as to meet a bonding requirement of the flip-chip light-emitting devices.

From another perspective, in the embodiment, the light-emitting device LED1-A is directly covered by the first color conversion pattern CCP1 or the optical pattern OTP-A, the light-emitting device LED2-A is directly covered by the optical pattern OTP-A, and the repair light-emitting device LEDr-A is directly covered by a light-transmitting pattern LTP-A. On the other hand, in the embodiment, similar to the optical pattern OTP-A, the light-transmitting pattern LTP-A and the first color conversion pattern CCP1 are also doped with a plurality of scattering particles SC, which may further enhance a light emission angle range and light emission uniformity of the light emitted by the repair light-emitting device LEDr-A after the light passes through the light-transmitting pattern LTP-A.

A fabrication method of the display panel 20 will be exemplarily described below.

Figures 6A, 6B:
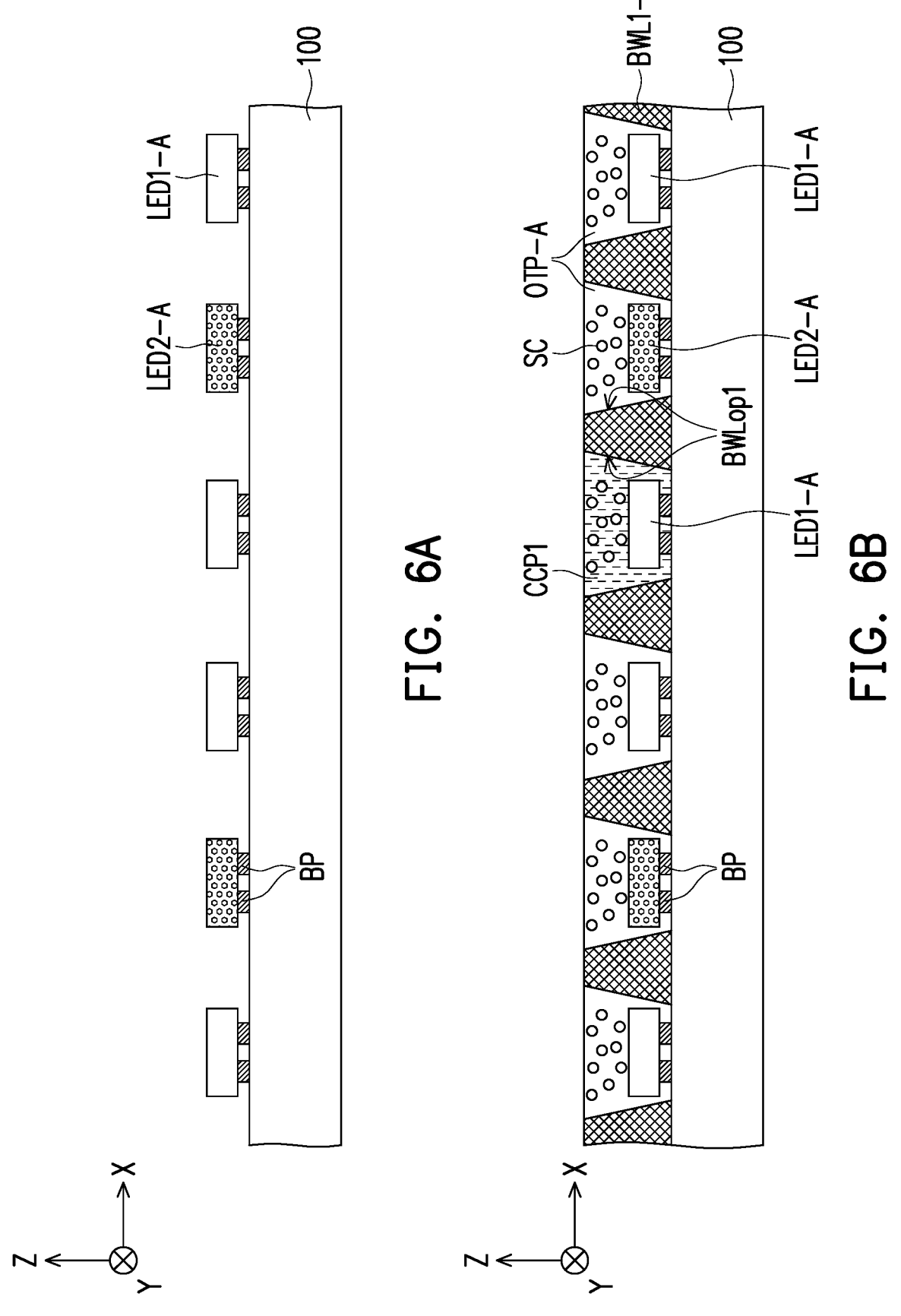
FIG. 6A to FIG. 6E are schematic cross-sectional views of a fabrication process of the display panel of FIG. 5.

Referring to FIG. 6A, first, the plurality of light-emitting devices LED1-A and the plurality of light-emitting devices LED2-A are electrically bonded to the circuit substrate 100. For example, these light-emitting devices may be placed on the circuit substrate 100 from a temporary substrate by mass transfer, but the invention is not limited thereto. Then, the barrier structure layer BWL1-A having a plurality of first openings BWLop1 is formed on the circuit substrate 100 to separate these light-emitting devices, as shown in FIG. 6B. A material of the barrier wall structure layer BWL1-A may include white resin, Bragg reflector or other materials with high reflectivity, but the invention is not limited thereto. In other embodiments, the material of the barrier wall structure layer BWL1-A may also include a black resin material or an organic material doped with carbon black.

After completing the fabrication of the barrier wall structure layer BWL1-A, the plurality of optical patterns OTP-A and the plurality of first color conversion patterns CCP1 doped with the scattering particles SC are respectively formed in the plurality of first openings BWLop1 of the barrier wall structure layer BWL1-A. A material of the scattering particles SC includes, for example, titanium dioxide.

Figure 6C:
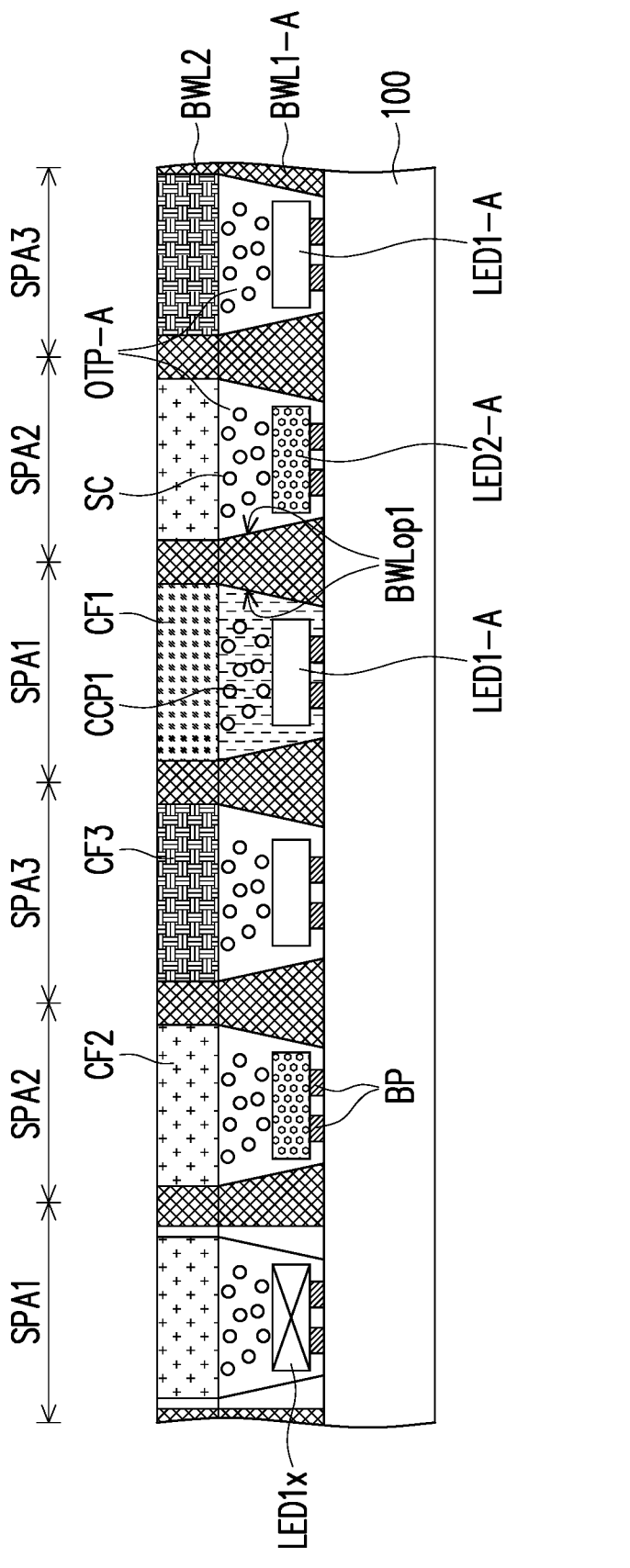

Referring to FIG. 6C, the color filter layer CFL having a plurality of filter patterns CF1-CF3 is formed on the plurality of first color conversion patterns CCP1 and the plurality of optical patterns OTP-A. Before forming the color filter layer CFL, a barrier wall structure layer BWL2 having a plurality of openings may be formed first, and the plurality of filter patterns CF1 to CF3 are respectively provided in these openings.

By now, the fabrication of the display panel is roughly completed. Then, an aging durability test of the display panel is performed. After the test is completed, an inspection step is performed to confirm whether all light-emitting devices are normal. For example, if it is detected that the light-emitting device LED1-A in one of the first display sub-pixel areas SPA1 is a damaged (or abnormal) light-emitting device LED1*x*, a repair process of the display panel is performed.

Figure 6D:
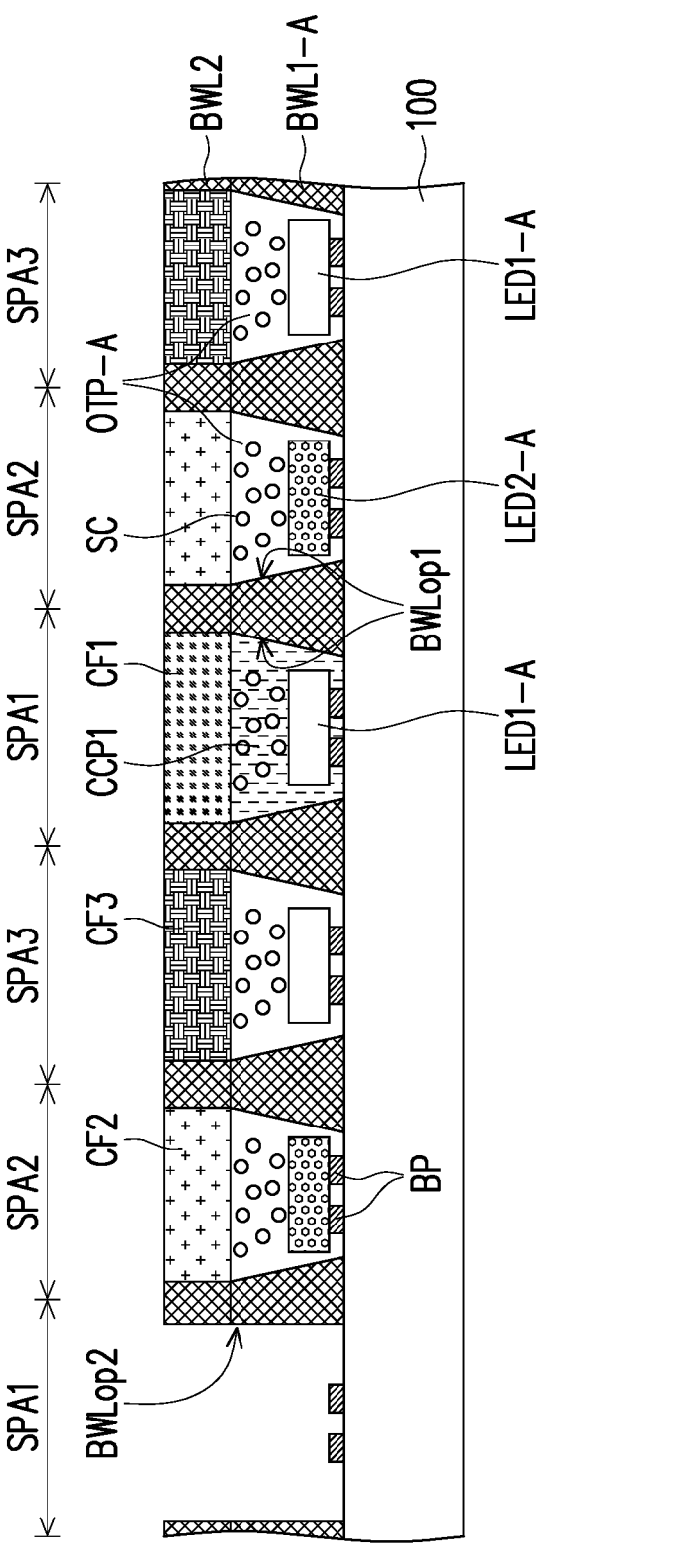

Referring to FIG. 6C and FIG. 6D, after detecting the damaged light-emitting device LED1*x*, the filter pattern CF1 overlapped with the damaged light-emitting device LED1*x* in the color filter layer CFL, the first color conversion pattern CCP1 overlapped with the damaged light-emitting device LED1*x*, the damaged light-emitting device LED1*x* and a portion of the barrier wall structure layer BWL1-A are removed to form a groove to expose the two bonding pads BP that are originally bonded to the damaged light-emitting device LED1*x*. The above-mentioned groove is, for example, composed of the second opening BWLop2 of the barrier wall structure layer BWL1-A and the opening of the barrier wall structure layer BWL2.

Figure 6E:
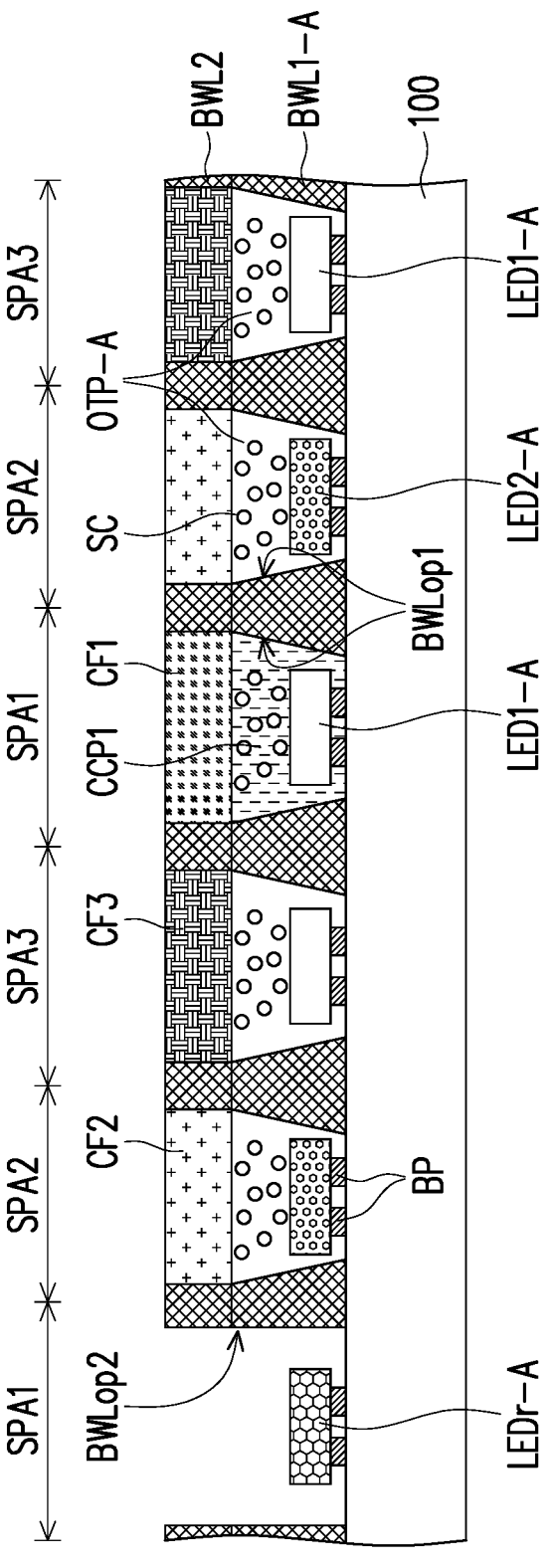

Then, the repair light-emitting device LEDr-A is electrically bonded to the circuit substrate 100 through the aforementioned groove (as shown in FIG. 6E) to replace the damaged and removed light-emitting device LED1*x*. Referring to FIG. 5, after completing the bonding step of the repair light-emitting device LEDr-A, the light-transmitting pattern LTP-A doped with the scattering particles SC is formed in the second opening BWLop2 of the barrier wall structure layer BWL1-A, and the light-transmitting pattern LTP-A is further filled in the opening of the barrier wall structure layer BWL2 (i.e., the light-transmitting pattern LTP-A penetrates the color filter layer CFL).

By now, the fabrication of the display panel 20 of the embodiment is completed.

In the embodiment, the display panel 20 includes the circuit substrate 100, the plurality of first display sub-pixels and the repaired display sub-pixel. The first display sub-pixel includes the light-emitting device LED1-A and the first color conversion pattern CCP1. The light-emitting device LED1-A is disposed on the circuit substrate 100 and is adapted to emit the first light with the first light-emitting color. The first color conversion pattern CCP1 is disposed on the light-emitting device LED1-A and is overlapped with the light-emitting device LED1-A. The first color conversion pattern CCP1 is adapted to convert the first light-emitting color of the first light into the first color. The first color is different from the first light-emitting color. The repaired display sub-pixel includes the repair light-emitting device LEDr-A, which is disposed on the circuit substrate 100 and has the second light-emitting color. The second light-emitting color is the same as the first color.

More clearly, there is no need to set the first color conversion pattern CCP1 in the repaired first display sub-pixel area SPA1, but the repair light-emitting device LEDr-A directly emits light with the display color. In this way, the repair process may be greatly simplified, which helps to improve a repair yield of the display panel 20.

Figure 7:
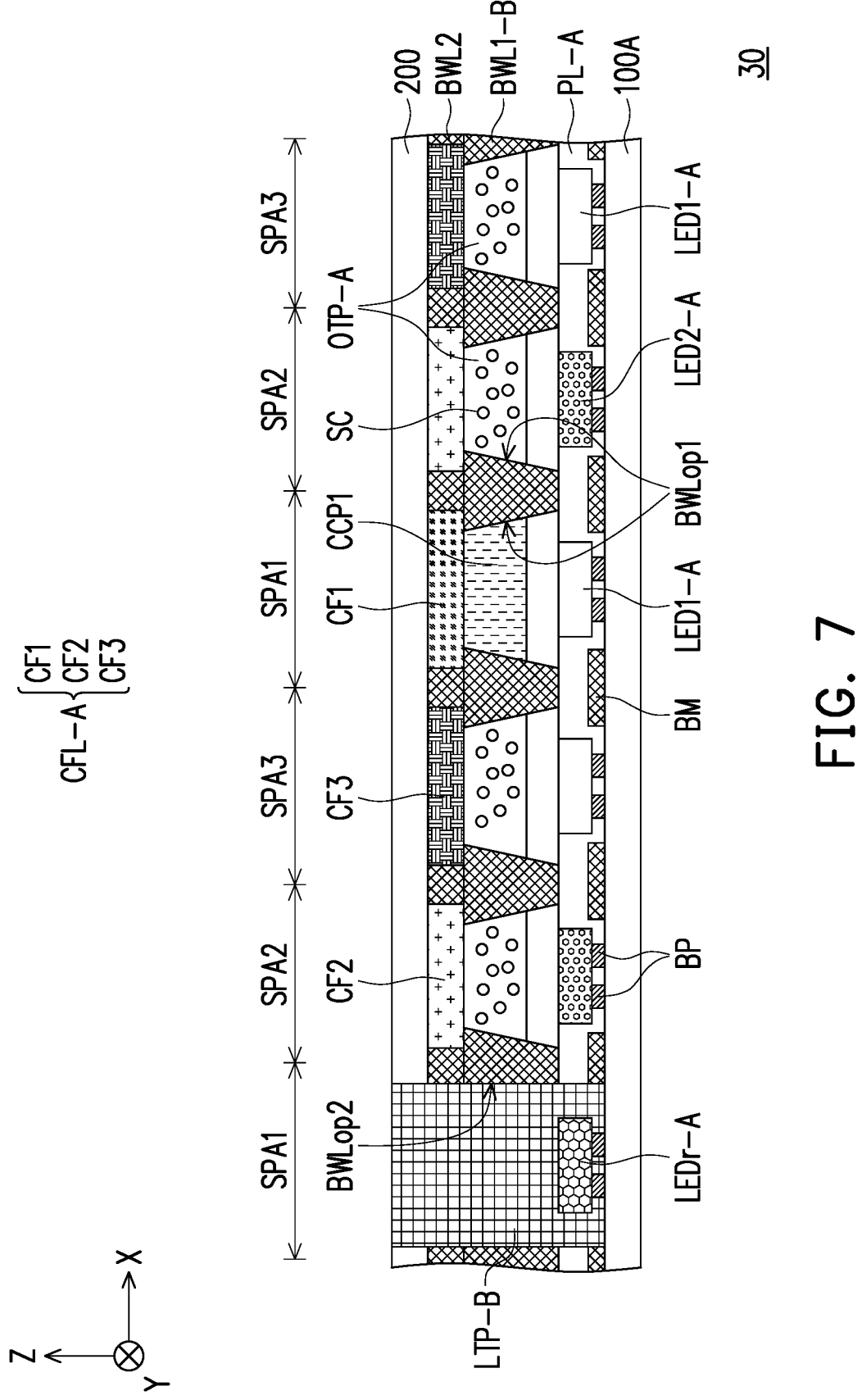
FIG. 7 is a schematic cross-sectional view of a display panel according to a fourth embodiment of the invention.

FIG. 7 is a schematic cross-sectional view of a display panel according to a fourth embodiment of the invention. FIG. 8A to FIG. 8E are schematic cross-sectional views of a fabrication process of the display panel of FIG. 7. Referring to FIG. 7, main differences between a display panel 30 of the embodiment and the display panel 20 of FIG. 5 lie in different configurations of the color conversion patterns, the optical patterns and the color filter layer.

Specifically, in the embodiment, the first color conversion patterns CCP1, the optical patterns OTP-A and a color filter layer CFL-A are not formed on a circuit substrate 100A, but are provided on a light-transmitting substrate 200. Therefore, a barrier wall structure layer BWL1-B and a barrier wall structure layer BWL2 of the embodiment are also formed on the light-transmitting substrate 200. Since the configuration relationship of the color conversion patterns, the optical patterns, the barrier wall structure layer BWL1-B and the barrier wall structure layer BWL2 on the light-transmitting substrate 200 is similar to that of the display panel 20 of FIG. 5, reference may be made to the relevant paragraphs of the aforementioned embodiments for detailed description, and details thereof are not repeated.

In the embodiment, the display panel 30 may also optionally include a black matrix layer BM and a planarization layer PL-A. The black matrix layer BM is provided on the circuit substrate 100A and is located between the plurality of light-emitting devices and the repair light-emitting device LEDr-A. The planarization layer PL-A covers the black matrix layer BM, the plurality of light-emitting devices and the repair light-emitting device LEDr-A.

It should be noted that in the embodiment, a light-transmitting pattern LTP-B filled in the second opening BWLop2 of the barrier wall structure layer BWL1-B penetrates the light-transmitting substrate 200.

The fabrication method of the display panel 30 will be exemplarily described below.

Figure 8A:
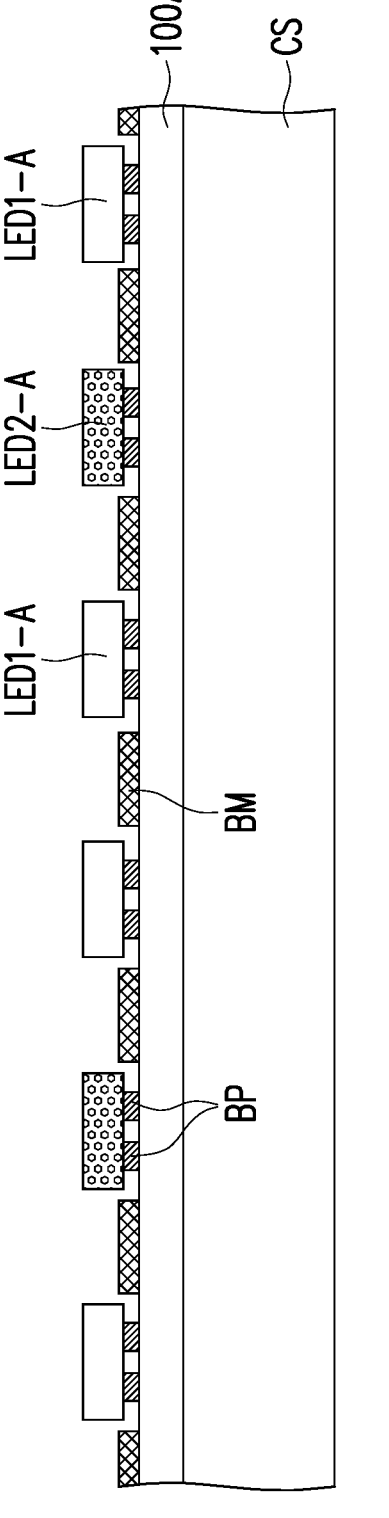
FIG. 8A to FIG. 8E are schematic cross-sectional views of a fabrication process of the display panel of FIG. 7.

Referring to FIG. 8A, first, the plurality of light-emitting devices LED1-A and the plurality of light-emitting devices LED2-A are electrically bonded to the circuit substrate 100A, and the planarization layer PL-A is formed between these light-emitting devices, so as to improve surface flatness on the circuit substrate 100A. For example, these light-emitting devices may be placed on the circuit substrate 100A from the temporary substrate by mass transfer, but the invention is not limited thereto. In the embodiment, the circuit substrate 100A is, for example, a flexible circuit board with flexibility. Therefore, during the fabrication process, the circuit substrate 100A may first be placed on a carrier CS to meet substrate stiffness required for bonding the light-emitting devices.

Figure 8B:
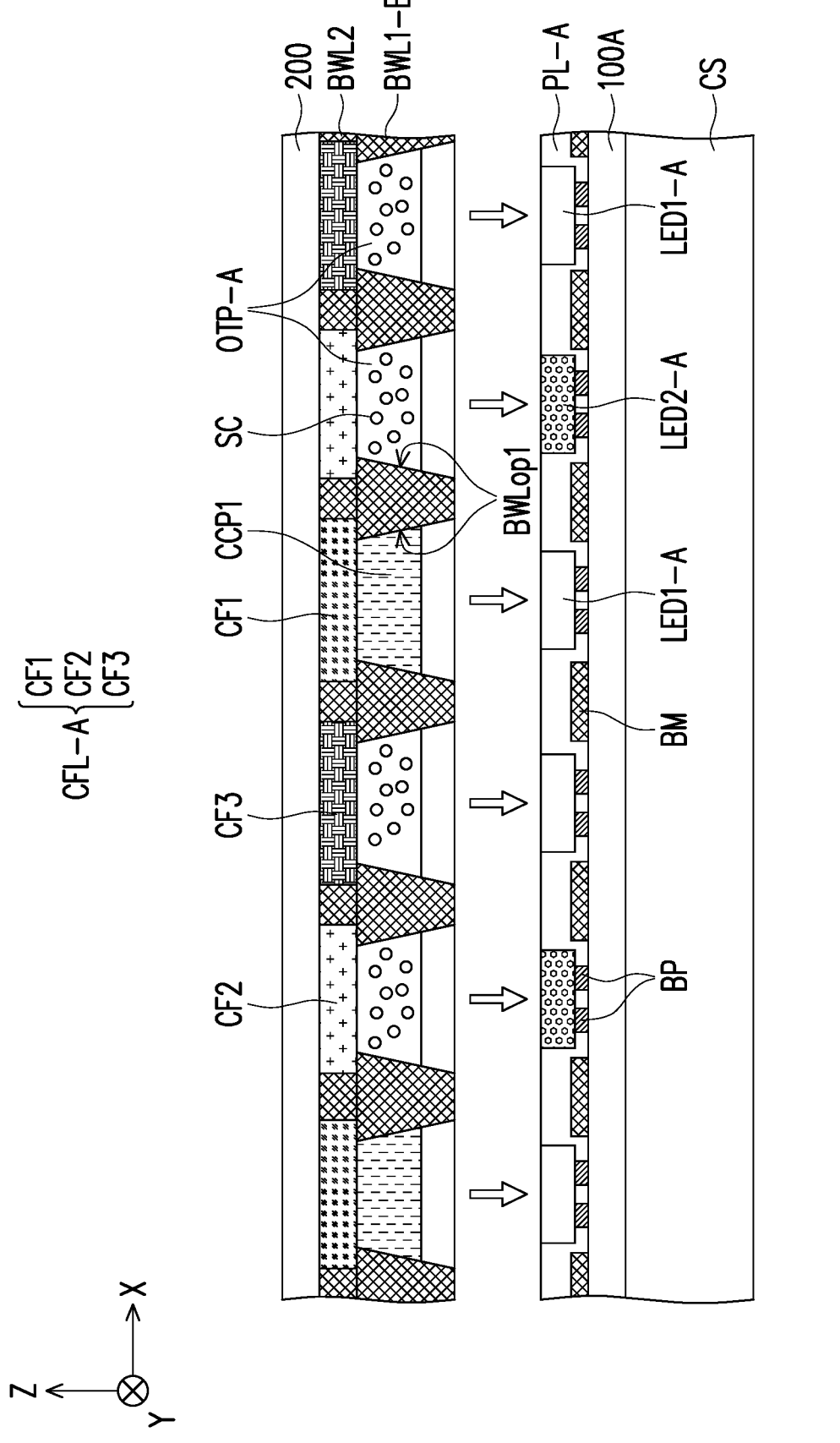

Then, the barrier wall structure layer BWL2, the color filter layer CFL-A, the barrier wall structure layer BWL1-B having a plurality of first openings BWLop1, a plurality of first color conversion patterns CCP1 and a plurality of optical patterns OTP-A are sequentially formed on the light-transmitting substrate 200. As shown in FIG. 8B, after completing the fabrication of the first color conversion patterns CCP1 and the optical patterns OTP-A, the circuit substrate 100A and the light-transmitting substrate 200 are assembled.

After the assembling, the fabrication of the display panel is roughly completed. Then, an aging durability test of the display panel is performed. After the test is completed, an inspection step is performed to confirm whether all light-emitting devices LED are normal. For example, if it is detected that the light-emitting device LED1-A in one of the first display sub-pixel areas SPA1 is a damaged (or abnormal) light-emitting device LED1x, a repair process of the display panel is performed.

Figure 8C:
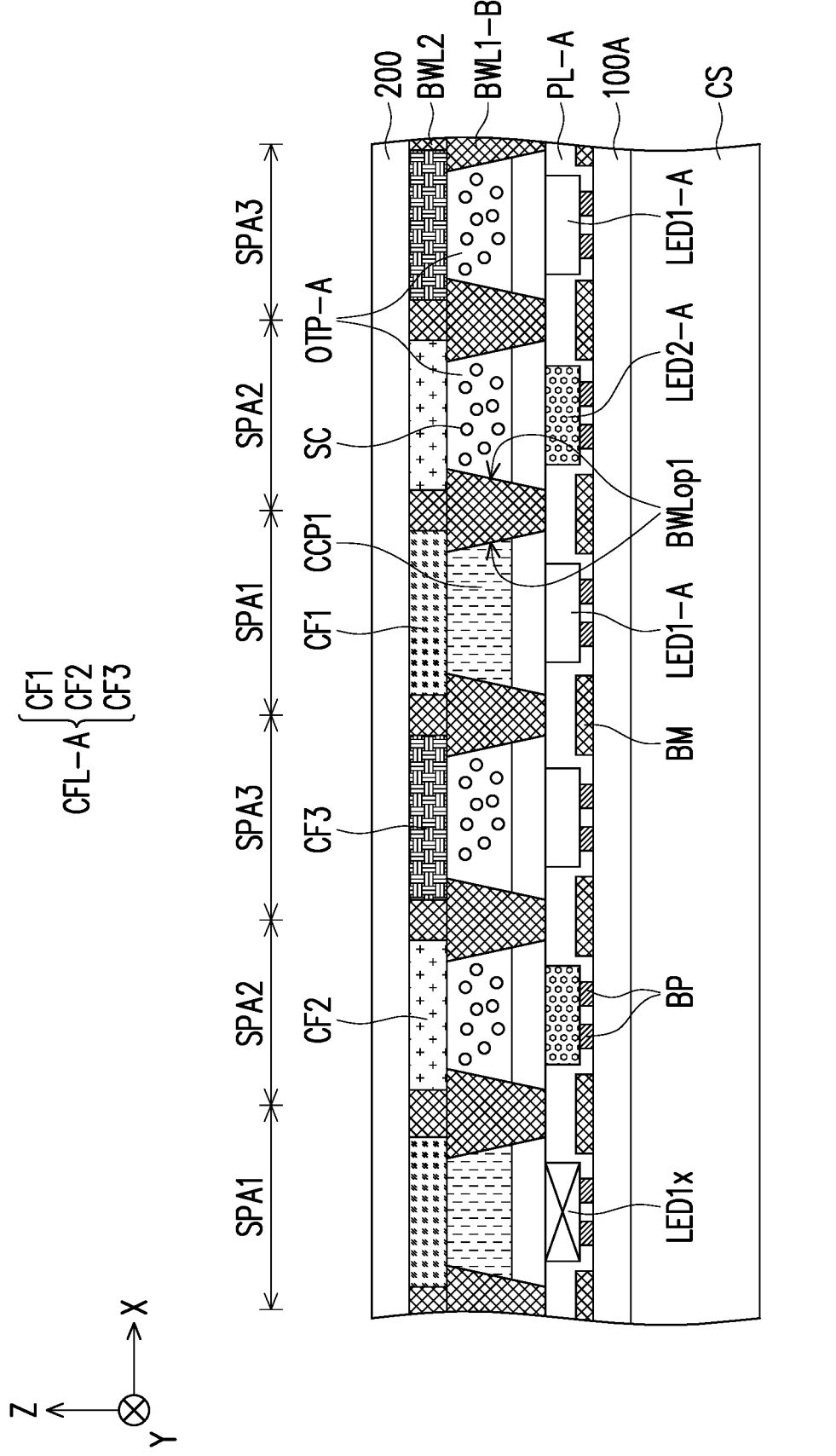
Figure 8D:
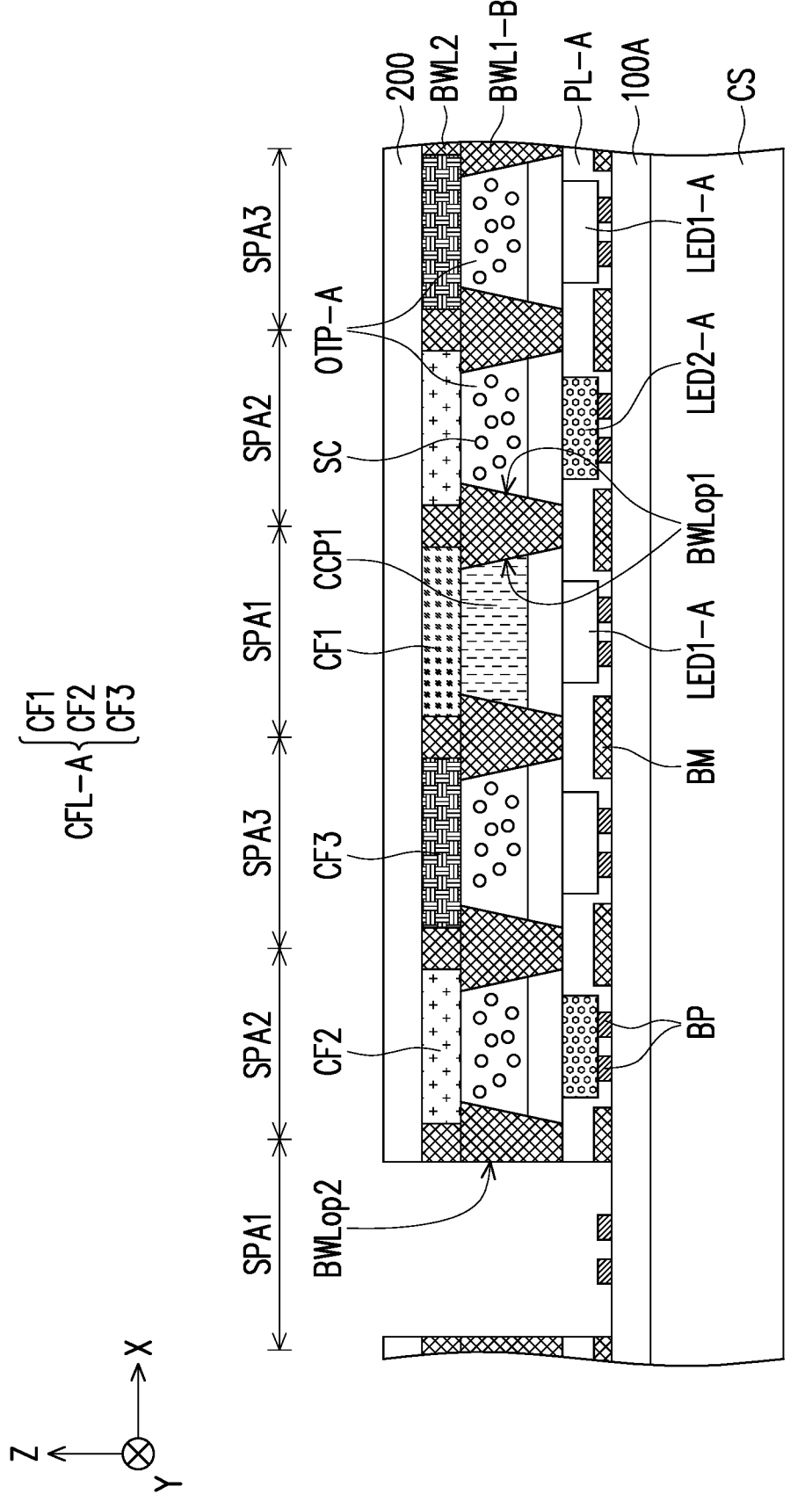

Referring to FIG. 8C and FIG. 8D, after detecting the damaged light-emitting device LED1x, the portion of the light-transmitting substrate 200 overlapped with the damaged light-emitting device LED1x, the filter pattern CF1 overlapped with the damaged light-emitting device LED1x in the color filter layer CFL, the first color conversion pattern CCP1 overlapped with the damaged light-emitting device LED1x, the damaged light-emitting device LED1x, a portion of the barrier wall structure layer BWL1-B, the portion of the planarization layer PL-A overlapped with the damaged light-emitting device LED1x and a portion of the black matrix layer BM are removed to form a groove to expose the two bonding pads BP that are originally bonded to the damaged light-emitting device LED1x. The above-mentioned groove is, for example, composed of the opening of the planarization layer PL, the second opening BWLop2 of the barrier wall structure layer BWL1-B, the opening of the barrier wall structure layer BWL2 and the opening of the light-transmitting substrate 200.

Figure 8E:
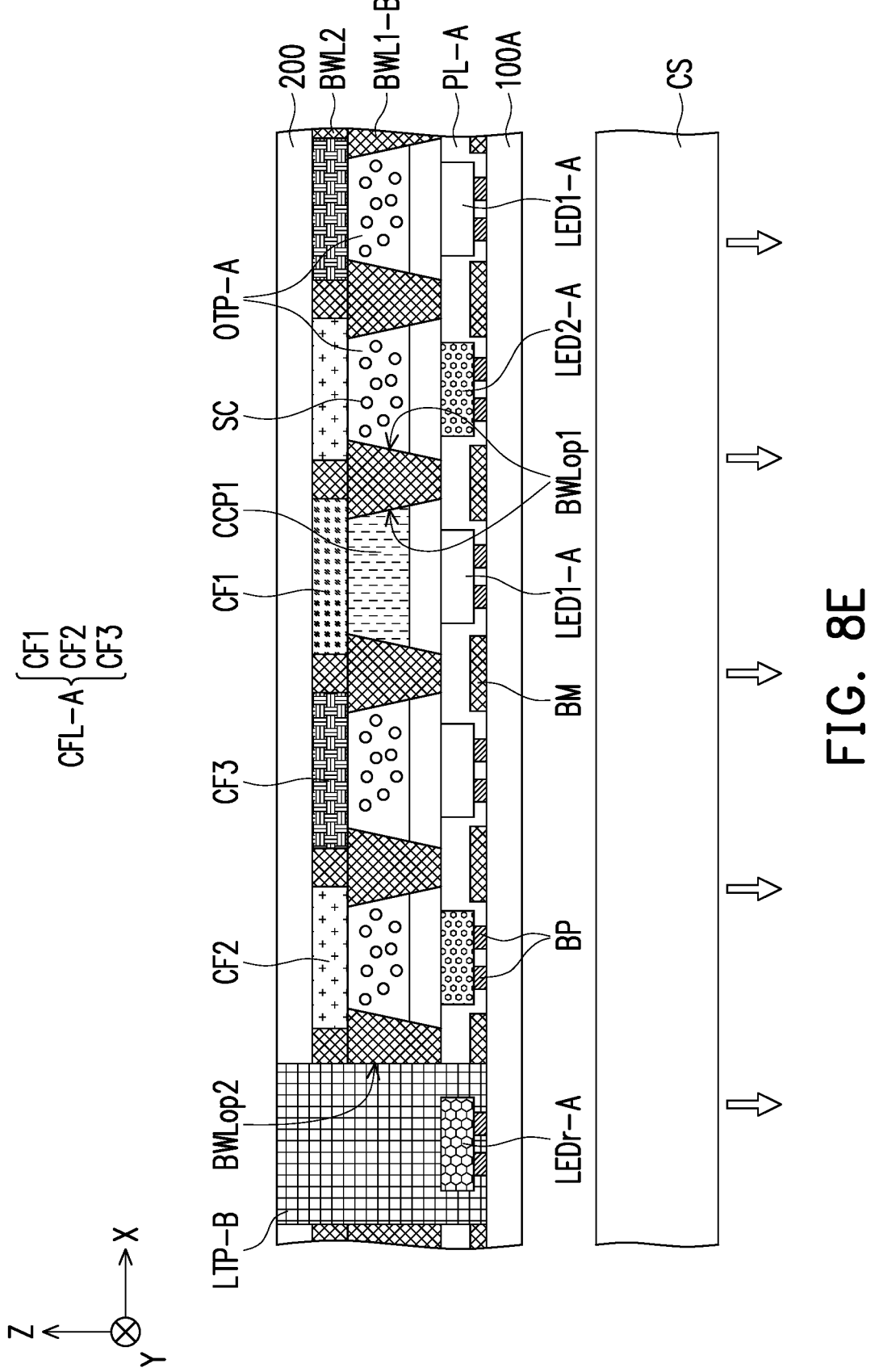

Referring to FIG. 8E, then, the repair light-emitting device LEDr-A is electrically bonded to the circuit substrate 100A through the aforementioned groove to replace the damaged and removed light-emitting device LED1x in FIG. 8C. After completing the bonding step of the repair light-emitting device LEDr-A, the light-transmitting pattern LTP-B is formed in the aforementioned groove. Namely, the light-transmitting pattern LTP-B penetrates the light-transmitting substrate 200, the color filter layer CFL-A, the barrier wall structure layer BWL1-B and the planarization layer PL-A, and covers the repair light-emitting device LEDr-A.

After the carrier CS is removed from the bottom of the circuit substrate 100A, the fabrication of the display panel 30 of the embodiment is completed.

Referring to FIG. 7, in the embodiment, the display panel 30 includes the circuit substrate 100A, the plurality of first display sub-pixels and the repaired display sub-pixel. The first display sub-pixel includes the light-emitting device LED1-A and the first color conversion pattern CCP1. The light-emitting device LED1-A is disposed on the circuit substrate 100 and is adapted to emit the first light with the first light-emitting color. The first color conversion pattern CCP1 is disposed on the light-emitting device LED1-A and is overlapped with the light-emitting device LED1-A. The first color conversion pattern CCP1 is adapted to convert the first light-emitting color of the first light into the first color. The first color is different from the first light-emitting color. The repaired display sub-pixel includes the repair light-emitting device LEDr-A, which is disposed on the circuit substrate 100 and has the second light-emitting color. The second light-emitting color is the same as the first color.

More clearly, there is no need to set the first color conversion pattern CCP1 in the repaired first display sub-pixel area SPA1, but the repair light-emitting device LEDr-A directly emits light with the display color. In this way, the repair process may be greatly simplified, which helps to improve a repair yield of the display panel 30.

Figure 9:
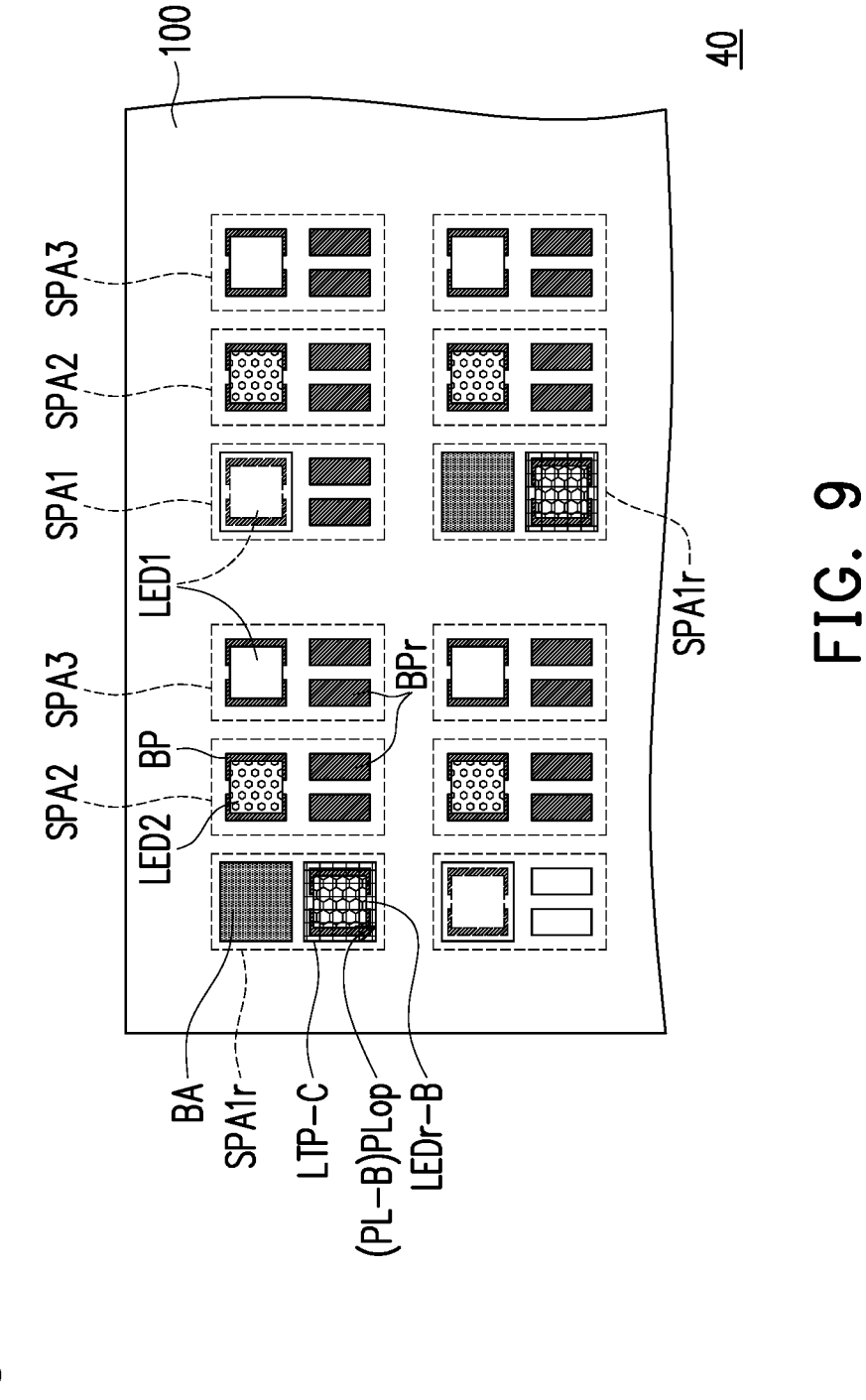
FIG. 9 is a schematic front view of a display panel according to a fifth embodiment of the invention.
Figure 10A:
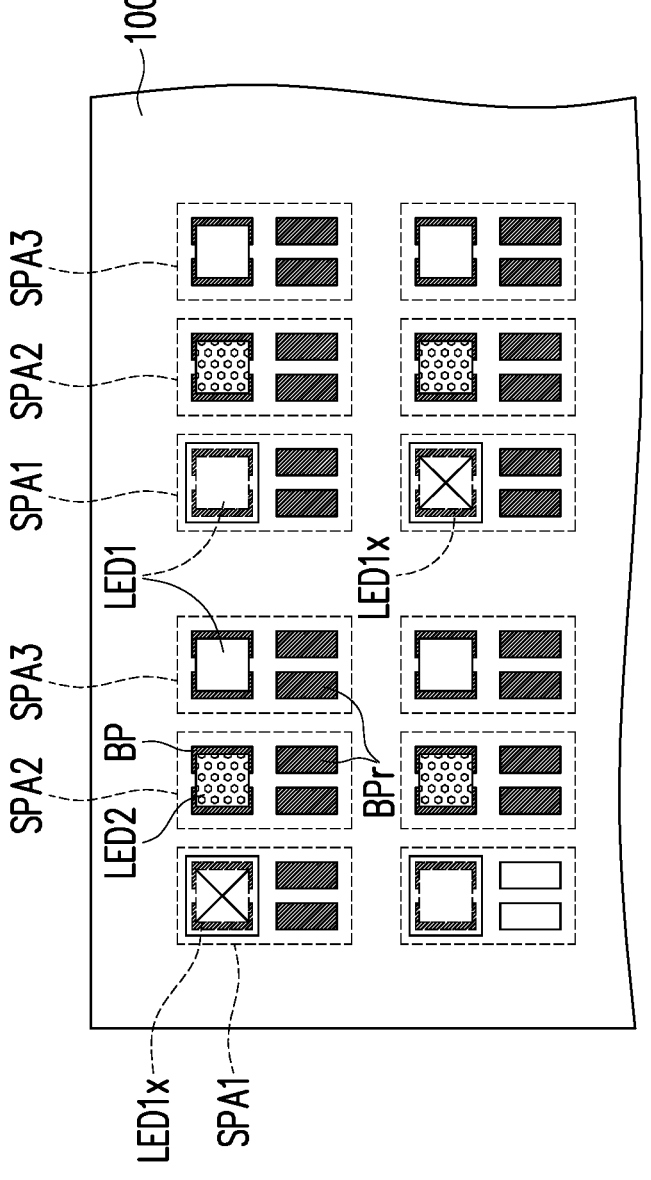
FIG. 10A to FIG. 10D are schematic front views of a fabrication process of the display panel of FIG. 9.

FIG. 9 is a schematic front view of a display panel according to a fifth embodiment of the invention. FIG. 10A to FIG. 10D are schematic front views of a fabrication process of the display panel of FIG. 9. FIG. 11 is a schematic front view of a display panel according to a sixth embodiment of the invention. Referring to FIG. 9, a main difference between a display panel 40 of the embodiment and the display panel 10 of FIG. 1 is that a bonding position of the repair light-emitting device is different.

Specifically, in the embodiment, the display panel 40 may optionally provide two repair bonding pads BPr in each display pixel area in addition to two bonding pads BP, but the invention is not limited thereto. In other embodiments, if the light-emitting device is a vertical type light-emitting device, a number of the repair bonding pad BPr in each display pixel area may be one. The repair bonding pad BPr is disposed adjacent to one side of the bonding pad BP, such as a lower side, but the invention is not limited thereto.

For example, the display panel 40 may have at least two repaired first display sub-pixel areas SPA1r. In each repaired first display sub-pixel area SPA1r, a black area BA is formed at a position where the light-emitting device LED1 is originally bonded, and the repair light-emitting device LEDr-B is bonded to the repair bonding pad BPr below. It should be noted that the planarization layer PL-B has an opening PLop overlapped with the two repair bonding pads BPr, and the opening PLop is filled with a light-transmitting pattern LTP-C to cover the repair light-emitting device LEDr-B.

Although not shown in the figure, the display panel 40 of the embodiment may further include the color filter layer, the barrier wall structure layer, the plurality of color conversion patterns and the plurality of optical patterns as shown in FIG. 2, FIG. 4 or FIG. 7. For detailed description, reference may be made to the relevant paragraphs of the foregoing embodiments, and details thereof are not repeated.

The following provides an exemplarily description of a repair method of the display panel of the embodiment.

After the display panel completes the durability test, an inspection step is performed to confirm whether all of the light-emitting devices are normal. As shown in FIG. 10A, if it is detected that the two light-emitting devices LED1 in the two first display sub-pixel areas SPA1 are damaged (or abnormal) light-emitting devices LED1x, the repair process of the display panel is performed.

Figure 10B:
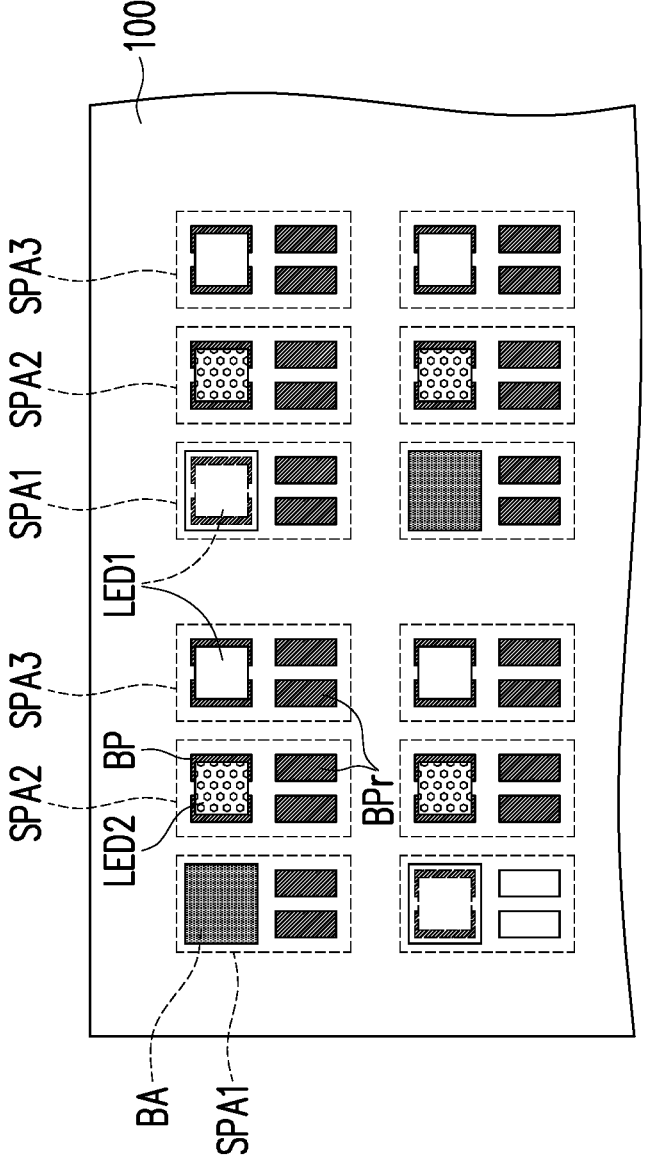
Figure 10C:
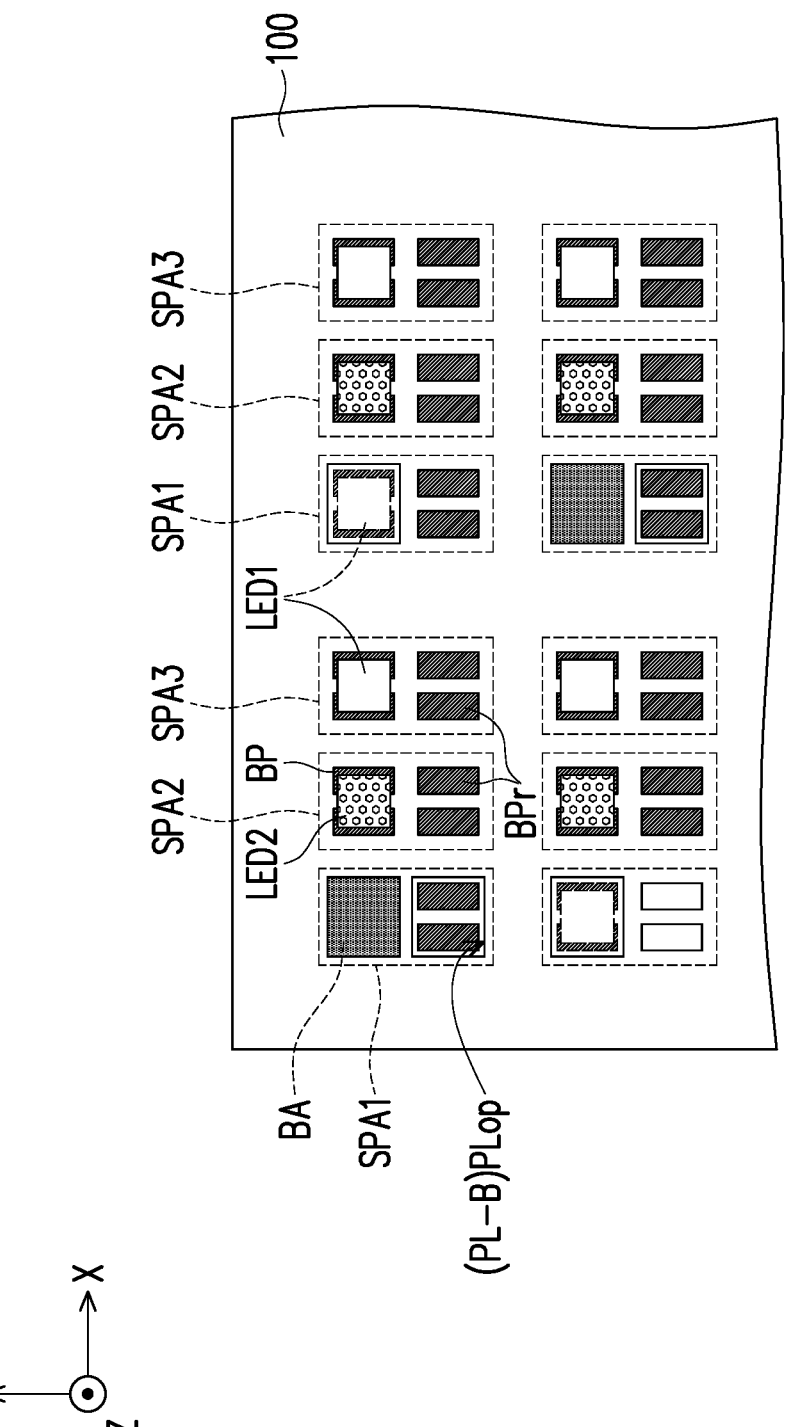
Figure 11:
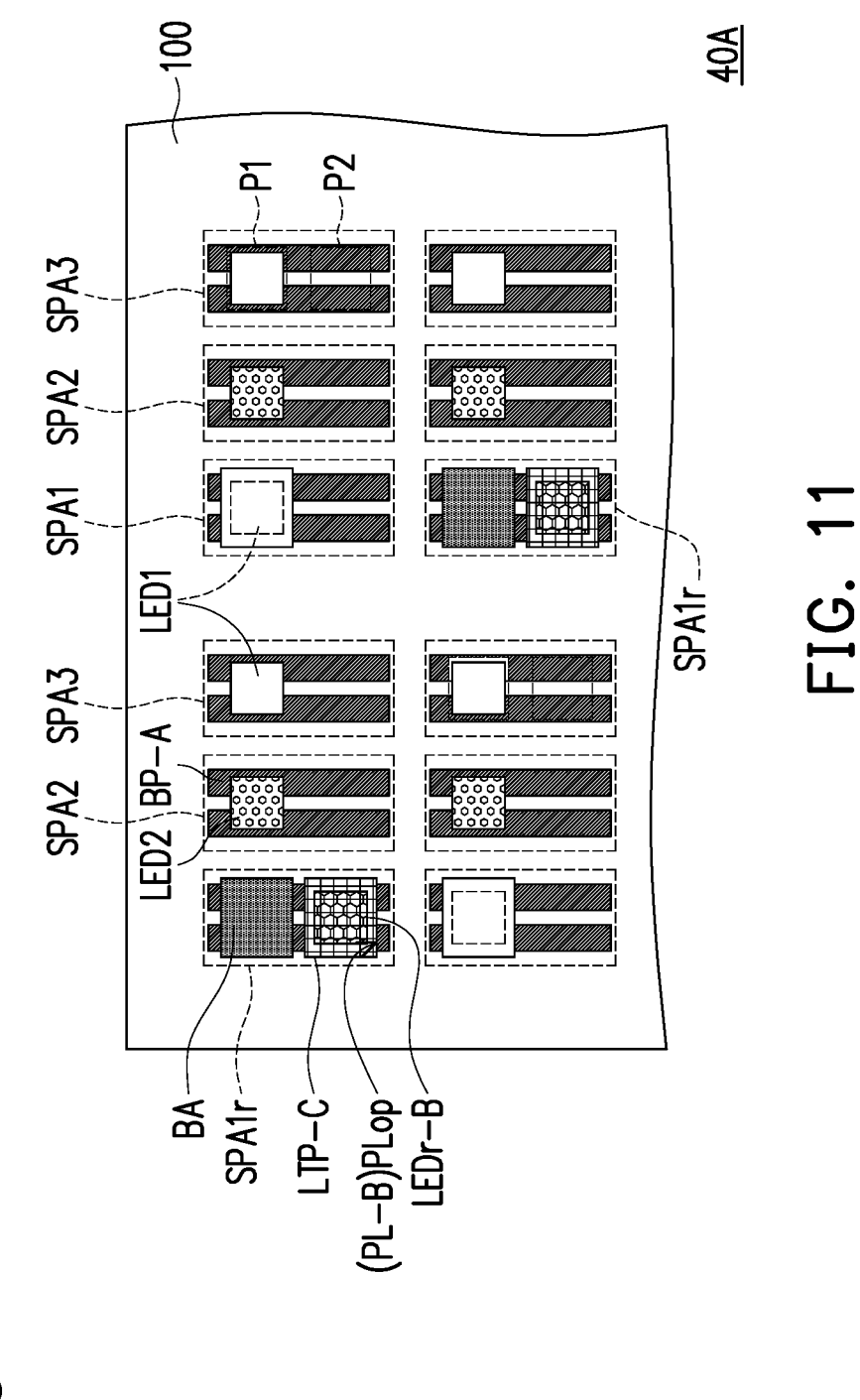
FIG. 11 is a schematic front view of a display panel according to a sixth embodiment of the invention.

Referring to FIG. 10B, first, the area where the damaged light-emitting device LED1x is located is sintered to form a black area BA. The sintering method includes, for example, laser sintering. Then, a portion of the planarization layer PL-B is removed to form a plurality of openings PLop. Each opening PLop exposes two repair bonding pads BPr disposed adjacent to one side of the black area BA, as shown in FIG. 10C. For example, in the embodiment, a laser glue removal technology may be used to form the opening PLop of the planarization layer PL-B, but the invention is not limited thereto.

Figure 10D:
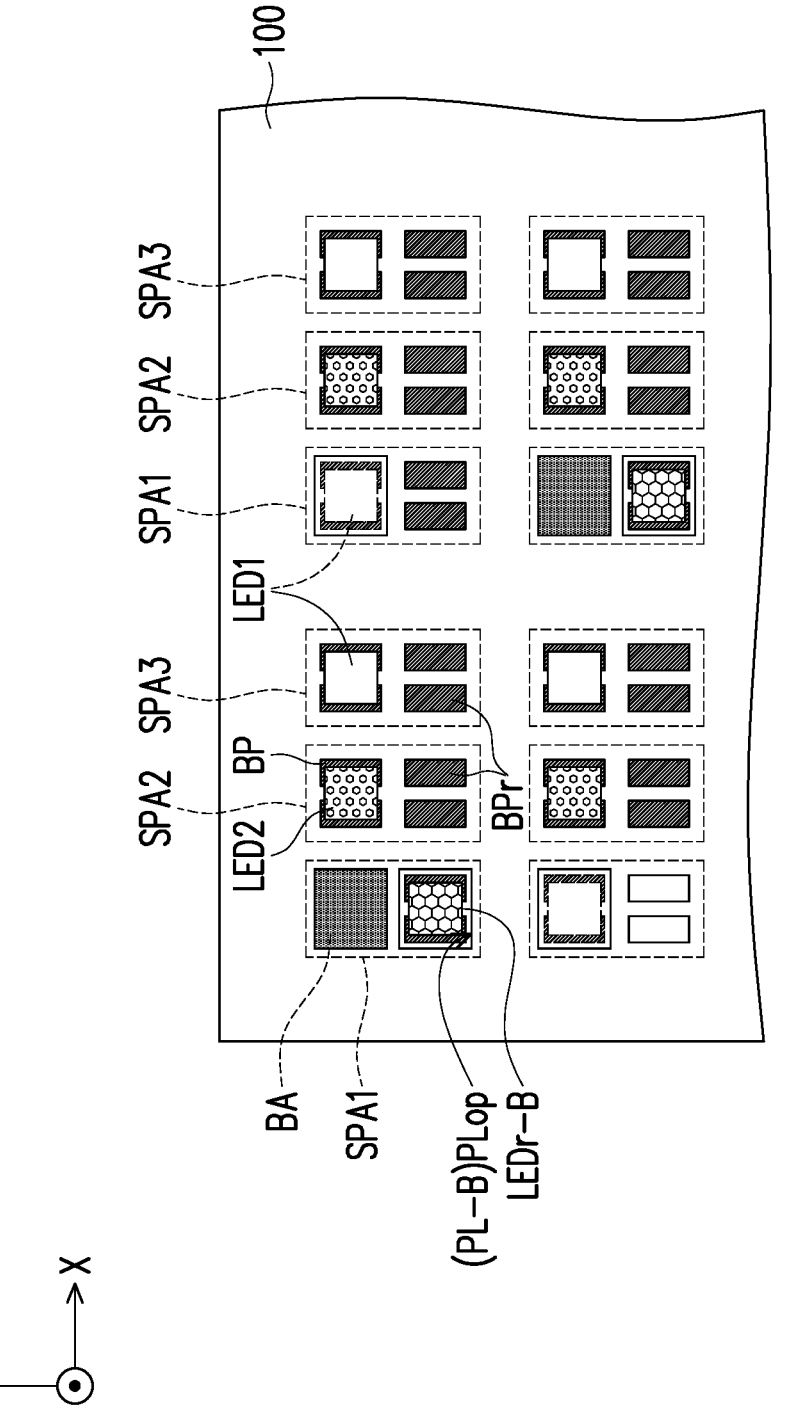

Then, the bonding step of the repair light-emitting device LEDr-B and the repair bonding pad BPr is performed, as shown in FIG. 10D. After the bonding step is completed, a light-transmitting pattern LTP-C is formed in the opening PLop of the planarization layer PL-B to cover the repair light-emitting device LEDr-B, as shown in FIG. 9. By now, the fabrication of the display panel 40 of the embodiment is completed.

In particular, by configuring the repair bonding pads BPr, the repair flexibility of the display panel may be greatly improved. For example, in the embodiment, the repair light-emitting device LEDr-B implements repairing by using off-site bonding. However, in other embodiments, even if the display panel is configured with the repair bonding pads BPr, the repair method (i.e., in-situ bonding)

of the aforementioned embodiment may still be used to replace the repair light-emitting device.

However, the invention is not limited thereto. In a display panel 40A of FIG. 11, the repair bonding pads and the initial bonding pads may be integrated. For example, a length of the bonding pad BP-A in each sub-pixel area of the display panel 40A along the direction Y may be two to three times than a length of the light-emitting device along the direction Y. Therefore, the bonding pad BP-A may have an initial bonding position P1 for bonding the light-emitting device (for example, the light-emitting device LED1 or the light-emitting device LED2) and a repair bonding position P2 for bonding the repair light-emitting device (for example, the repair light-emitting device LEDr-B). Namely, the light-emitting device and the repair light-emitting device may be bonded to the same bonding pad BP-A but at different positions.

In summary, in the display panel and the method of fabricating the same according to an embodiment of the invention, the plurality of display sub-pixels used to display the first color are each provided with a light-emitting device and a color conversion pattern overlapped with each other, where the color conversion pattern is suitable for converting the light-emitting color of the light-emitting device into the first color. If the light-emitting device of one of the display sub-pixels is detected to be abnormal or damaged, the abnormal or damaged light-emitting device may be replaced by the repair light-emitting device having the first color. In this way, the repairability of the display panel after product test in the back-end process may be greatly improved, which helps to reduce generation of scrap products and improve the production yield.

What is claimed is:

1. A display panel, comprising:
a circuit substrate;
a plurality of first display sub-pixels, each comprising:
    a light-emitting device, disposed on the circuit substrate, adapted to emit first light with a first light-emitting color; and
    a first color conversion pattern, arranged on the light-emitting device, overlapped with the light-emitting device, and adapted to convert the first light-emitting color of the first light into a first color, wherein the first color is different from the first light-emitting color; and
a repaired display sub-pixel, comprising:
    a repair light-emitting device, arranged on the circuit substrate, and having a second light-emitting color, wherein the second light-emitting color is the same as the first color.

2. The display panel as claimed in claim 1, further comprising:
a common electrode layer, disposed on the plurality of light-emitting devices of the first display sub-pixels and the repair light-emitting device, electrically connected to the light-emitting devices and the repair light-emitting device, and having an opening overlapped with the repair light-emitting device, wherein the light-emitting devices and the repair light-emitting device are a plurality of vertical type light-emitting devices.

3. The display panel as claimed in claim 2, further comprising:
a transparent conductive glue layer, filled in the opening of the common electrode layer, wherein the repair light-emitting device is electrically connected to the common electrode layer through the transparent conductive glue layer.

4. The display panel as claimed in claim 1, further comprising:

a plurality of second display sub-pixels, each including:

another light-emitting device, arranged on the circuit substrate, and adapted to emit second light with the first light-emitting color; and a second color conversion pattern, arranged on the another light-emitting device, overlapped with the another light-emitting device, and adapted to convert the first light-emitting color of the second light into a second color, wherein the second color is different from the first color.

5. The display panel as claimed in claim 1, further comprising:

a barrier wall structure layer, arranged on the light-emitting device and the repair light-emitting device, and comprising:

a plurality of first openings, respectively overlapped with the plurality of light-emitting devices of the first display sub-pixels, wherein the plurality of first color conversion patterns are respectively arranged in the first openings; and a second opening, overlapped with the repair light-emitting device, wherein a light-transmitting pattern is disposed in the second opening.

6. The display panel as claimed in claim 5, further comprising:

a color filter layer, arranged on the plurality of first color conversion patterns, and having a plurality of filter patterns, the filter patterns are respectively overlapped with the first color conversion patterns, wherein the light-transmitting pattern penetrates the color filter layer.

7. The display panel as claimed in claim 5, wherein the light-transmitting pattern is doped with a plurality of scattering particles.

8. The display panel as claimed in claim 5, further comprising:

a planarization layer, arranged on the circuit substrate, covering the light-emitting devices, and having an opening overlapped with the repair light-emitting device, wherein the light-transmitting pattern is filled in the opening of the planarization layer.

9. The display panel as claimed in claim 5, further comprising:

a light-transmitting substrate, arranged on the light-emitting devices, wherein the light-transmitting pattern penetrates the light-transmitting substrate.

10. The display panel as claimed in claim 1, wherein the second light-emitting color of the repair light-emitting device is red.

11. The display panel as claimed in claim 1, wherein the repair light-emitting device is a ternary light-emitting diode.

12. The display panel as claimed in claim 1, wherein the circuit substrate is configured with a plurality of sub-pixel areas, the first display sub-pixels and the repaired display sub-pixel are respectively arranged in the sub-pixel areas, each sub-pixel area is further provided with at least one bonding pad and at least one repair bonding pad, the light-emitting device is electrically bonded to the at least one bonding pad, and the repair light-emitting device is electrically bonded to the at least one repair bonding pad.

13. The display panel as claimed in claim 1, wherein the circuit substrate is configured with a plurality of sub-pixel areas, each of the sub-pixel areas is configured with at least one bonding pad, the at least one boding pad has an initial bonding position and a repair bonding position, and the initial bonding position of the at least one bonding pad in each of the sub-pixel areas is bonded with the light-emitting device of one of the first display sub-pixels, and the repair light-emitting device is bonded to the repair bonding position of the at least one bonding pad in one of the sub-pixel areas.

14. The display panel as claimed in claim 1, further comprising:

a barrier wall structure layer, arranged on the circuit substrate, and having a plurality of first openings and a second opening, the plurality of light-emitting devices are respectively arranged in the first openings, and the repair light-emitting device is arranged in the second opening, wherein the plurality of first color conversion patterns are respectively arranged in the first openings, and cover the light-emitting devices, a light-transmitting pattern is arranged in the second opening, and the light-transmitting pattern covers the repair light-emitting device.

15. A method of fabricating a display panel, comprising:

electrically bonding a plurality of light-emitting devices to a circuit substrate, wherein each of the light-emitting device is adapted to emit first light with a first light-emitting color;

forming a plurality of color conversion patterns, wherein the plurality of color conversion patterns are respectively overlapped with the plurality of light-emitting devices, each of the color conversion patterns is adapted to convert the first light-emitting color of the first light into a first color, and the first color is different from the first light-emitting color;

performing an inspection step to confirm a damaged one of the light-emitting devices; and electrically bonding a repair light-emitting device to the circuit substrate to replace the damaged one of the light-emitting devices, wherein the repair light-emitting device has a second light-emitting color, and the second light-emitting color is the same as the first color.

16. The method of fabricating the display panel as claimed in claim 15, further comprising:

respectively forming a plurality of filter patterns on the color conversion patterns, wherein after detecting the damaged one of the light-emitting devices, one of the filter patterns overlapped with the damaged one of the light-emitting devices is removed.

17. The method of fabricating the display panel as claimed in claim 15, further comprising:

forming a common electrode layer on the light-emitting devices, wherein the common electrode layer is electrically connected to the light-emitting devices, after detecting the damaged one of the light-emitting devices, a portion of the common electrode layer overlapped with the damaged one of the light-emitting devices is removed to form an opening.

18. The method of fabricating the display panel as claimed in claim 17, wherein after completing the bonding step of the repair light-emitting device, a transparent conductive glue layer is formed in the opening of the common electrode layer.

19. The method of fabricating the display panel as claimed in claim 15, further comprising:

forming a barrier wall structure layer with a plurality of first openings, wherein the color conversion patterns are respectively formed in the first openings.

20. The method of fabricating the display panel as claimed in claim 15, further comprising:

after forming the color conversion patterns on a light-transmitting substrate, assembling the circuit substrate with the light-transmitting substrate.

21. The method of fabricating the display panel as claimed in claim 20, wherein after detecting the damaged one of the light-emitting devices, a portion of the light-transmitting substrate overlapped with the damaged one of the light-emitting devices is removed.

22. The method of fabricating the display panel as claimed in claim 15, further comprising:

removing one of the color conversion patterns overlapped with the damaged one of the light-emitting devices; and removing the damaged one of the light-emitting devices.

23. The method of fabricating the display panel as claimed in claim 15, further comprising:

after completing the bonding step of the light-emitting devices and the circuit substrate, forming a planarization layer to cover the light-emitting devices, wherein before the bonding step of the repair light-emitting device, a portion of the planarization layer is removed to expose at least one repair bonding pad adjacent to one side of the damaged one of the light-emitting devices, and the at least one repair bonding pad is adapted to bond the repair light-emitting device.

24. The method of fabricating the display panel as claimed in claim 23, further comprising:

before the bonding step of the repair light-emitting device, performing laser sintering on an area provided with the damaged one of the light-emitting devices to form a black area.

25. The method of fabricating the display panel as claimed in claim 15, further comprising:

after completing the bonding step of the repair light-emitting device, forming a light-transmitting pattern to cover the repair light-emitting device.

\* \* \* \* \*